(12) United States Patent
Smalley

(10) Patent No.: US 11,262,383 B1
(45) Date of Patent: Mar. 1, 2022

(54) PROBES HAVING IMPROVED MECHANICAL AND/OR ELECTRICAL PROPERTIES FOR MAKING CONTACT BETWEEN ELECTRONIC CIRCUIT ELEMENTS AND METHODS FOR MAKING

(71) Applicant: Microfabrica Inc., Van Nuys, CA (US)

(72) Inventor: Garret R. Smalley, Newhall, CA (US)

(73) Assignee: Microfabrica Inc., Van Nuys, CA (US)

( * ) Notice: Subject to any disclaimer, the term of this patent is extended or adjusted under 35 U.S.C. 154(b) by 115 days.

(21) Appl. No.: 16/584,818

(22) Filed: Sep. 26, 2019

Related U.S. Application Data

(60) Provisional application No. 62/736,998, filed on Sep. 26, 2018.

(51) Int. Cl.
  *G01R 1/067* (2006.01)
  *G01R 3/00* (2006.01)

(52) U.S. Cl.
  CPC ..... *G01R 1/06761* (2013.01); *G01R 1/06716* (2013.01); *G01R 1/06738* (2013.01); *G01R 1/06744* (2013.01); *G01R 3/00* (2013.01)

(58) Field of Classification Search
  CPC ............ G01R 1/06761; G01R 1/06755; G01R 1/06711; G01R 1/067; G01R 1/06; G01R 3/00; G01R 1/06744; G01R 1/06716; G01R 1/06738
  See application file for complete search history.

(56) References Cited

U.S. PATENT DOCUMENTS

| | | |
|---|---|---|
| 2,306,082 A | 12/1942 | Prest |
| 3,240,685 A | 3/1966 | Maissel |
| 3,697,401 A | 10/1972 | Lucas et al. |
| 3,723,197 A | 3/1973 | Buschow et al. |
| 3,745,105 A | 7/1973 | Kosowsky et al. |
| 3,832,632 A | 8/1974 | Ardezzone |
| 3,835,017 A | 9/1974 | Mentone et al. |
| 3,874,855 A | 4/1975 | Legrand |
| 3,909,332 A | 9/1975 | Yerman |
| 3,926,916 A | 12/1975 | Mastrangelo |
| 4,043,891 A | 8/1977 | Alkire et al. |
| 4,080,267 A | 3/1978 | Castellani et al. |
| 4,126,533 A | 11/1978 | Lukyanchikov et al. |
| 4,155,815 A | 5/1979 | Francis et al. |
| 4,187,553 A | 2/1980 | Ahn et al. |
| 4,294,669 A | 10/1981 | Lincoln et al. |
| 4,298,436 A | 11/1981 | Thomas |

(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161-168.

(Continued)

*Primary Examiner* — Lee E Rodak
(74) *Attorney, Agent, or Firm* — Dennis R. Smalley

(57) ABSTRACT

Embodiments are directed to microscale and millimeter scale multi-layer structures (e.g., probe structures for making contact between two electronic components for example in semiconductor wafer, chip, and electronic component test applications). One or more layers of the structures include shell and core regions formed of different materials wherein the core regions are offset from a symmetric, longitudinally extending position.

1 Claim, 12 Drawing Sheets

(56) References Cited

U.S. PATENT DOCUMENTS

| | | |
|---|---|---|
| 4,306,925 A | 12/1981 | Lebow et al. |
| 4,370,941 A | 2/1983 | Belton |
| 4,376,017 A | 3/1983 | Urion |
| 4,404,080 A | 9/1983 | Jahani |
| 4,452,684 A | 6/1984 | Palnik |
| 4,495,385 A | 1/1985 | Roberts et al. |
| 4,537,647 A | 8/1985 | Foster |
| 4,575,330 A | 3/1986 | Hull |
| 4,600,555 A | 7/1986 | Shimizu |
| 4,610,062 A | 9/1986 | Roberts et al. |
| 4,752,352 A | 6/1988 | Feygin |
| 4,764,449 A | 8/1988 | Vanlseghem |
| 4,770,754 A | 9/1988 | Meuldijk et al. |
| 4,773,877 A | 9/1988 | Kruger et al. |
| 4,920,639 A | 5/1990 | Yee |
| 4,921,583 A | 5/1990 | Sewell et al. |
| 4,952,272 A | 8/1990 | Okino et al. |
| 4,954,192 A | 9/1990 | Dziekan |
| 4,955,523 A | 9/1990 | Carlommagno et al. |
| 4,961,052 A | 10/1990 | Tada et al. |
| 4,961,154 A | 10/1990 | Pomerantz et al. |
| 4,985,116 A | 1/1991 | Mettler et al. |
| 5,011,580 A | 4/1991 | Pan et al. |
| 5,017,738 A | 5/1991 | Tsuji et al. |
| 5,020,219 A | 6/1991 | Leedy |
| 5,048,747 A | 9/1991 | Clark et al. |
| 5,059,359 A | 10/1991 | Hull et al. |
| 5,070,297 A | 12/1991 | Kwon et al. |
| 5,106,461 A | 4/1992 | Volfson et al. |
| 5,128,612 A | 7/1992 | Aton et al. |
| 5,173,055 A | 12/1992 | Grabbe |
| 5,177,438 A | 1/1993 | Littlebury et al. |
| 5,189,507 A | 2/1993 | Carlomagno et al. |
| 5,190,637 A | 3/1993 | Guckel |
| 5,209,817 A | 5/1993 | Ahmad et al. |
| 5,209,878 A | 5/1993 | Smalley et al. |
| 5,271,822 A | 12/1993 | Nolan et al. |
| 5,273,691 A | 12/1993 | Hull et al. |
| 5,286,208 A | 2/1994 | Matsuoka |
| 5,297,967 A | 3/1994 | Baumberger et al. |
| 5,301,415 A | 4/1994 | Prinz et al. |
| 5,321,685 A | 6/1994 | Nose et al. |
| 5,347,086 A | 9/1994 | Potter et al. |
| 5,354,712 A | 10/1994 | Ho et al. |
| 5,366,380 A | 11/1994 | Reymond |
| 5,369,881 A | 12/1994 | Inaba et al. |
| 5,378,583 A | 1/1995 | Guckel et al. |
| 5,395,508 A | 3/1995 | Jolly et al. |
| 5,413,668 A | 5/1995 | Aslam et al. |
| 5,433,911 A | 7/1995 | Ozimek et al. |
| 5,435,902 A | 7/1995 | Andre |
| 5,436,412 A | 7/1995 | Ahmad et al. |
| 5,472,539 A | 12/1995 | Saia et al. |
| 5,476,211 A | 12/1995 | Khandros |
| 5,476,818 A | 12/1995 | Yanof et al. |
| 5,478,699 A | 12/1995 | Blessington et al. |
| 5,501,784 A | 3/1996 | Lessmo/ Ilmann et al. |
| 5,512,162 A | 4/1996 | Sachs et al. |
| 5,512,163 A | 4/1996 | Warfield |
| 5,513,430 A | 5/1996 | Yanof et al. |
| 5,545,045 A | 8/1996 | Wakamatsu |
| 5,560,837 A | 10/1996 | Trueba |
| 5,578,185 A | 11/1996 | Bergeron et al. |
| 5,596,504 A | 1/1997 | Tata et al. |
| 5,599,194 A | 2/1997 | Ozawa et al. |
| 5,605,614 A | 2/1997 | Bornand |
| 5,614,075 A | 3/1997 | Andre |
| 5,641,391 A | 6/1997 | Hunter et al. |
| 5,686,689 A | 11/1997 | Snedeker et al. |
| 5,700,607 A | 12/1997 | Rath et al. |
| 5,722,861 A | 3/1998 | Wetter |
| 5,766,441 A | 6/1998 | Arndt et al. |
| 5,772,451 A | 6/1998 | Dozier et al. |
| 5,786,270 A | 7/1998 | Gorrell et al. |
| 5,805,971 A | 9/1998 | Akedo |
| 5,806,181 A | 9/1998 | Khandros et al. |
| 5,811,982 A | 9/1998 | Beaman et al. |
| 5,820,014 A | 10/1998 | Dozier et al. |
| 5,829,128 A | 11/1998 | Eldridge et al. |
| 5,832,834 A | 11/1998 | Nishino et al. |
| 5,864,946 A | 2/1999 | Eldridge et al. |
| 5,874,011 A | 2/1999 | Ehrlich |
| 5,876,424 A | 3/1999 | Michael |
| 5,891,285 A | 4/1999 | Nakayama |
| 5,892,223 A | 4/1999 | Karpov et al. |
| 5,917,707 A | 6/1999 | Khandros et al. |
| 5,923,637 A | 7/1999 | Shimada et al. |
| 5,945,058 A | 8/1999 | Manners et al. |
| 5,970,610 A | 10/1999 | Yumikura et al. |
| 5,974,662 A | 11/1999 | Eldridge et al. |
| 5,989,994 A | 11/1999 | Khoury et al. |
| 5,994,152 A | 11/1999 | Khandros et al. |
| 5,999,184 A | 12/1999 | Smalley et al. |
| 6,002,179 A | 12/1999 | Chan et al. |
| 6,016,000 A | 1/2000 | Moslehi |
| 6,019,784 A | 2/2000 | Hines |
| 6,023,103 A | 2/2000 | Chang et al. |
| 6,027,630 A | 2/2000 | Cohen |
| 6,029,096 A | 2/2000 | Manners et al. |
| 6,043,563 A | 3/2000 | Eldridge et al. |
| 6,044,548 A | 4/2000 | Distefano et al. |
| 6,046,597 A | 4/2000 | Barabi |
| 6,051,875 A | 4/2000 | Dando |
| 6,064,213 A | 5/2000 | Khandros et al. |
| 6,074,896 A | 6/2000 | Dando |
| 6,085,968 A | 7/2000 | Swindlehurst et al. |
| 6,150,186 A | 11/2000 | Chen et al. |
| 6,166,915 A | 12/2000 | Lake et al. |
| 6,184,053 B1 | 2/2001 | Eldridge et al. |
| 6,197,180 B1 | 3/2001 | Kelly |
| 6,208,155 B1 | 3/2001 | Barabi et al. |
| 6,208,225 B1 | 3/2001 | Miller |
| 6,218,910 B1 | 4/2001 | Miller |
| 6,239,385 B1 | 5/2001 | Schwiebert et al. |
| 6,250,933 B1 | 6/2001 | Khoury et al. |
| 6,255,126 B1 | 7/2001 | Mathieu et al. |
| 6,256,882 B1 | 7/2001 | Gleason et al. |
| 6,264,477 B1 | 7/2001 | Smith et al. |
| 6,268,015 B1 | 7/2001 | Mathieu et al. |
| 6,268,261 B1 | 7/2001 | Petrarca et al. |
| 6,278,284 B1 | 8/2001 | Mori et al. |
| 6,287,891 B1 | 9/2001 | Sayyah |
| 6,288,198 B1 | 9/2001 | Mechtel et al. |
| 6,289,781 B1 | 9/2001 | Cohen |
| 6,293,808 B1 | 9/2001 | Ochiai |
| 6,294,840 B1 | 9/2001 | McCormick |
| 6,307,392 B1 | 10/2001 | Soejima et al. |
| 6,333,741 B1 | 12/2001 | Snead et al. |
| 6,336,269 B1 | 1/2002 | Eldridge et al. |
| 6,344,752 B1 | 2/2002 | Hagihara et al. |
| 6,351,133 B1 | 2/2002 | Jones et al. |
| 6,359,454 B1 | 3/2002 | Khoury |
| 6,413,852 B1 | 7/2002 | Grill et al. |
| 6,426,638 B1 | 7/2002 | Di Stefano |
| 6,441,315 B1 | 8/2002 | Eldridge et al. |
| 6,456,099 B1 | 9/2002 | Eldridge et al. |
| 6,471,524 B1 | 10/2002 | Nakano et al. |
| 6,471,538 B2 | 10/2002 | Zhou et al. |
| 6,475,369 B1 | 11/2002 | Cohen |
| 6,482,013 B2 | 11/2002 | Eldridge et al. |
| 6,483,328 B1 | 11/2002 | Eldridge et al. |
| 6,491,968 B1 | 12/2002 | Mathieu et al. |
| 6,499,216 B1 | 12/2002 | Fjelstad |
| 6,509,751 B1 | 1/2003 | Mathieu et al. |
| 6,520,778 B1 | 2/2003 | Eldridge et al. |
| 6,539,531 B2 | 3/2003 | Miller et al. |
| 6,560,861 B2 | 5/2003 | Fork et al. |
| 6,572,742 B1 | 6/2003 | Cohen |
| 6,586,955 B2 | 7/2003 | Fjelstad et al. |
| 6,596,624 B1 | 7/2003 | Romankiw |
| 6,616,966 B2 | 9/2003 | Mathieu et al. |
| 6,624,648 B2 | 9/2003 | Eldridge et al. |
| 6,626,708 B2 | 9/2003 | Phillips |
| 6,627,483 B2 | 9/2003 | Ondricek et al. |

(56) References Cited

U.S. PATENT DOCUMENTS

| | | |
|---|---|---|
| 6,627,980 B2 | 9/2003 | Eldridge |
| 6,640,415 B2 | 11/2003 | Eslamy et al. |
| 6,651,325 B2 | 11/2003 | Lee et al. |
| 6,667,628 B2 | 12/2003 | Ahrikencheikh et al. |
| 6,672,875 B1 | 1/2004 | Mathieu et al. |
| 6,676,438 B2 | 1/2004 | Zhou et al. |
| 6,678,948 B1 | 1/2004 | Benzler et al. |
| 6,690,185 B1 | 2/2004 | Khandros et al. |
| 6,690,186 B2 | 2/2004 | Fjelstad |
| 6,692,145 B2 | 2/2004 | Gianchandani et al. |
| 6,705,876 B2 | 3/2004 | Eldridge |
| 6,713,374 B2 | 3/2004 | Eldridge et al. |
| 6,727,579 B1 | 4/2004 | Eldridge et al. |
| 6,729,019 B2 | 5/2004 | Grube et al. |
| 6,734,566 B2 | 5/2004 | Honda |
| 6,771,084 B2 | 8/2004 | Di Stefano |
| 6,777,319 B2 | 8/2004 | Grube et al. |
| 6,778,742 B2 | 8/2004 | Brown et al. |
| 6,783,405 B1 | 8/2004 | Yen |
| 6,787,456 B1 | 9/2004 | Kripesh et al. |
| 6,788,086 B2 | 9/2004 | Hantschel et al. |
| 6,790,377 B1 | 9/2004 | Cohen |
| 6,794,890 B1 | 9/2004 | Tokumo et al. |
| 6,811,406 B2 | 11/2004 | Grube |
| 6,817,052 B2 | 11/2004 | Grube |
| 6,827,584 B2 | 12/2004 | Mathieu et al. |
| 6,838,893 B2 | 1/2005 | Khandros, Jr. et al. |
| 6,838,894 B2 | 1/2005 | MacIntyre |
| 6,844,748 B2 | 1/2005 | Sato et al. |
| 6,849,170 B2 | 2/2005 | Jerominek et al. |
| 6,856,156 B2 | 2/2005 | Liang et al. |
| 6,888,362 B2 | 5/2005 | Eldridge et al. |
| 6,913,468 B2 | 7/2005 | Dozier, II et al. |
| 6,945,827 B2 | 9/2005 | Grube et al. |
| 6,948,940 B2 | 9/2005 | Lindsey et al. |
| 6,965,244 B2 | 11/2005 | Miller |
| 6,967,493 B2 | 11/2005 | Mori et al. |
| 7,024,763 B2 | 4/2006 | Mathieu et al. |
| 7,047,638 B2 | 5/2006 | Eldridge et al. |
| 7,063,541 B2 | 6/2006 | Grube et al. |
| 7,074,650 B2 | 7/2006 | Honda |
| 7,086,149 B2 | 8/2006 | Eldridge et al. |
| 7,098,540 B1 | 8/2006 | Mohan et al. |
| 7,109,118 B2 | 9/2006 | Cohen et al. |
| 7,126,220 B2 | 10/2006 | Lahiri et al. |
| 7,142,000 B2 | 11/2006 | Eldridge et al. |
| 7,160,429 B2 | 1/2007 | Cohen et al. |
| 7,168,160 B2 | 1/2007 | Chen |
| 7,195,989 B2 | 3/2007 | Lockard et al. |
| 7,198,704 B2 | 4/2007 | Cohen et al. |
| 7,229,542 B2 | 6/2007 | Bang |
| 7,235,166 B2 | 6/2007 | Cohen et al. |
| 7,239,219 B2 | 7/2007 | Brown et al. |
| 7,241,689 B2 | 7/2007 | Kim et al. |
| 7,252,861 B2 | 8/2007 | Smalley |
| 7,265,562 B2 | 9/2007 | Chen et al. |
| 7,265,565 B2 | 9/2007 | Chen et al. |
| 7,271,888 B2 | 9/2007 | Frodis et al. |
| 7,273,812 B2 | 9/2007 | Kim et al. |
| 7,287,322 B2 | 10/2007 | Mathieu et al. |
| 7,288,178 B2 | 10/2007 | Cohen et al. |
| 7,291,254 B2 | 11/2007 | Cohen et al. |
| 7,326,327 B2 | 2/2008 | Armstrong et al. |
| 7,363,705 B2 | 4/2008 | Kim et al. |
| 7,368,044 B2 | 5/2008 | Cohen et al. |
| 7,412,767 B2 | 8/2008 | Kim et al. |
| 7,498,714 B2 | 3/2009 | Lockard et al. |
| 7,501,328 B2 | 3/2009 | Lockard et al. |
| 7,511,523 B2 | 3/2009 | Chen et al. |
| 7,516,980 B2 | 4/2009 | Kobayashi et al. |
| 7,527,721 B2 | 5/2009 | Lembrikov et al. |
| 7,531,077 B2 | 5/2009 | Cohen et al. |
| 7,533,462 B2 | 5/2009 | Gleason et al. |
| 7,557,595 B2 | 7/2009 | Chen et al. |
| 7,569,164 B2 | 8/2009 | Sakurai et al. |
| 7,611,616 B2 | 11/2009 | Cohen et al. |
| 7,640,651 B2 | 1/2010 | Cohen et al. |
| 7,679,388 B2 | 3/2010 | Chen et al. |
| 7,798,822 B2 | 9/2010 | Eldridge et al. |
| 8,613,846 B2 | 12/2013 | Wu et al. |
| 8,717,054 B2 | 5/2014 | Chen et al. |
| 8,717,055 B2 | 5/2014 | Chen et al. |
| 8,723,543 B2 | 5/2014 | Chen et al. |
| 8,729,916 B2 | 5/2014 | Chen et al. |
| 9,540,233 B2 | 1/2017 | Kumar et al. |
| 9,671,429 B2 | 6/2017 | Wu et al. |
| 9,878,401 B1 | 1/2018 | Veeramani et al. |
| 10,215,775 B2 | 2/2019 | Wu et al. |
| 10,416,192 B2 | 9/2019 | Chen et al. |
| 10,641,792 B2 | 5/2020 | Wu et al. |
| 2001/0004556 A1 | 6/2001 | Zhou et al. |
| 2002/0017915 A1 | 2/2002 | Kamiya |
| 2002/0053734 A1 | 5/2002 | Eldridge et al. |
| 2002/0067181 A1 | 6/2002 | Eldridge et al. |
| 2002/0153912 A1 | 10/2002 | Di Stefano |
| 2002/0155735 A1 | 10/2002 | Zhou et al. |
| 2002/0180473 A1 | 12/2002 | Di Stefano |
| 2002/0196038 A1 | 12/2002 | Okuno et al. |
| 2003/0024635 A1 | 2/2003 | Utsunomiya |
| 2003/0049951 A1 | 3/2003 | Eldridge et al. |
| 2003/0127336 A1 | 7/2003 | Cohen et al. |
| 2003/0143492 A1 | 7/2003 | Sexton |
| 2003/0161750 A1 | 8/2003 | Moxson et al. |
| 2003/0183008 A1 | 10/2003 | Bang et al. |
| 2003/0186405 A1 | 10/2003 | Lee et al. |
| 2003/0218244 A1 | 11/2003 | Lahiri et al. |
| 2003/0221968 A1 | 12/2003 | Cohen et al. |
| 2003/0222738 A1 | 12/2003 | Brown et al. |
| 2003/0234179 A1 | 12/2003 | Bang |
| 2004/0000489 A1 | 1/2004 | Zhang et al. |
| 2004/0004001 A1 | 1/2004 | Cohen et al. |
| 2004/0004002 A1 | 1/2004 | Thompson et al. |
| 2004/0007468 A1 | 1/2004 | Cohen et al. |
| 2004/0007470 A1 | 1/2004 | Smalley |
| 2004/0020782 A1 | 2/2004 | Cohen et al. |
| 2004/0065550 A1 | 4/2004 | Zhang |
| 2004/0065555 A1 | 4/2004 | Zhang |
| 2004/0068869 A1 | 4/2004 | Eldridge et al. |
| 2004/0072452 A1 | 4/2004 | Eldridge et al. |
| 2004/0072456 A1 | 4/2004 | Dozier et al. |
| 2004/0112637 A1 | 6/2004 | Kim et al. |
| 2004/0123651 A1 | 7/2004 | Hantschel et al. |
| 2004/0134772 A1 | 7/2004 | Cohen et al. |
| 2004/0134788 A1 | 7/2004 | Cohen et al. |
| 2004/0140862 A1 | 7/2004 | Brown et al. |
| 2004/0146650 A1 | 7/2004 | Lockard et al. |
| 2004/0147124 A1 | 7/2004 | Cohen et al. |
| 2004/0182716 A1 | 9/2004 | Cohen et al. |
| 2004/0251142 A1 | 12/2004 | Cohen et al. |
| 2005/0029109 A1 | 2/2005 | Zhang et al. |
| 2005/0029225 A1 | 2/2005 | Zhang |
| 2005/0032362 A1 | 2/2005 | Cohen et al. |
| 2005/0032375 A1 | 2/2005 | Lockard et al. |
| 2005/0045585 A1 | 3/2005 | Zhang et al. |
| 2005/0067292 A1 | 3/2005 | Thompson et al. |
| 2005/0072681 A1 | 4/2005 | Cohen et al. |
| 2005/0104609 A1 | 5/2005 | Arat et al. |
| 2005/0108876 A1 | 5/2005 | Mathieu et al. |
| 2005/0142739 A1 | 6/2005 | Kumar et al. |
| 2005/0142846 A1 | 6/2005 | Frodis et al. |
| 2005/0148214 A1 | 7/2005 | Mathieu et al. |
| 2005/0176285 A1 | 8/2005 | Chen et al. |
| 2005/0179458 A1 | 8/2005 | Chen et al. |
| 2005/0184748 A1 | 8/2005 | Chen et al. |
| 2005/0189958 A1 | 9/2005 | Chen et al. |
| 2005/0202667 A1 | 9/2005 | Cohen et al. |
| 2005/0215023 A1 | 9/2005 | Cohen et al. |
| 2005/0221644 A1 | 10/2005 | Kim et al. |
| 2005/0230261 A1 | 10/2005 | Cohen et al. |
| 2006/0006888 A1 | 1/2006 | Kruglick et al. |
| 2006/0071677 A1 | 4/2006 | Feigenbaum et al. |
| 2006/0108678 A1 | 5/2006 | Kumar et al. |
| 2006/0109016 A1 | 5/2006 | Arat et al. |
| 2006/0208751 A1 | 9/2006 | Chen |

(56) References Cited

U.S. PATENT DOCUMENTS

| | | |
|---|---|---|
| 2006/0216920 A1 | 9/2006 | Kojima |
| 2006/0226015 A1 | 10/2006 | Smalley et al. |
| 2006/0238209 A1 | 10/2006 | Chen et al. |
| 2007/0109004 A1 | 5/2007 | Chen et al. |
| 2007/0144841 A1 | 6/2007 | Chong et al. |
| 2007/0170940 A1 | 7/2007 | Chen et al. |
| 2007/0182427 A1 | 8/2007 | Chen et al. |
| 2008/0050524 A1 | 2/2008 | Kumar et al. |
| 2008/0100315 A1 | 5/2008 | Arat et al. |
| 2008/0111573 A1 | 5/2008 | Chen et al. |
| 2008/0121343 A1 | 5/2008 | Cohen et al. |
| 2008/0174332 A1 | 7/2008 | Arat et al. |
| 2009/0066351 A1 | 3/2009 | Arat et al. |
| 2010/0051466 A1 | 3/2010 | Smalley et al. |
| 2010/0176834 A1 | 7/2010 | Chen et al. |
| 2011/0132767 A1 | 6/2011 | Wu et al. |
| 2011/0187397 A1 | 8/2011 | Chen et al. |
| 2011/0187398 A1 | 8/2011 | Chen et al. |
| 2014/0197145 A1* | 7/2014 | Veeramani ............ B23K 26/38 219/121.72 |
| 2014/0231264 A1 | 8/2014 | Chen et al. |
| 2015/0308006 A1 | 10/2015 | Cohen et al. |
| 2016/0231356 A1 | 8/2016 | Wu et al. |
| 2017/0307657 A1* | 10/2017 | Crippa ............... G01R 1/06761 |
| 2019/0204354 A1 | 7/2019 | Chen et al. |
| 2019/0227099 A1 | 7/2019 | Chen et al. |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999, pp. 55-60.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

CRC Handbook of Chemistry and Physics, 93rd Ed. 2012-2013, p. (12-41)-(12-42).

Dixit et al., "Chapter 2, Overview of Interconnect-Copper and Low-k Integration" In Handbook of Semiconductor Manufacturing Technology, Second Edition, pp. 2-1 to 2-15, 2007.

Hill, Dr. Steve, "An E-FAB Way for Making the Micro World", Materials World is the journal of The Institute of Materials, Sep. 1999, vol. 7, No. 9, pp. 538-539.

Kumar, et al., "Features of gold having micrometer to centimeter dimensions can be formed through a combination of stamping with an elastomeric stamp . . ." Appln. Phys. Lett., Jul. 1993, 63(14):2002-2004.

Madden, John D. et al., "Three-Dimensional Microfabrication by Localized, Electrochemical Deposition", J. of Micro. Sys., Mar. 1996, 5(1):24-32.

Marques, et al., "Fabrication of High-Aspect-Ratio Microstructures on Planar and Nonplanar Surfaces Using a Modified LIGA Process", Dec. 1997, 6(4):329-336.

Nikolay V. Vasilyev, et al., "Beating-Heart Pach Closure of Muscular Ventricular Septal Defects Under Real-Time Three Dimensional Echocardiographic Guidance: A Preclinical Study", J. Thorac, Cardiovas. Surg., 2008, pp. 603-609, vol. 153, No. 3, The American Association of Thoracic Surgery.

Nikolay V. Vasilyev, et al., "Three Dimensional Echo and Videocardioscopy-Gulded Atrial Septal Defect Closure", Ann. Thorac. Surg., 2006, pp. 1322-1326, vol. 82, The Society of Thoracic Surgeons.

Osterberg, Peter M., et al., "MEMBUILDER: An Automated 3D Solid Model Construction Program for Microelectromechanical Structures", The 8th Int'l Conference on Solid-State Sensors and Actuators, and Eurosensors IX; Jun. 25-29, 1995; pp. 21-24; Stockholm, Sweden.

Taylor, et al., "'Spatial Forming' A Three Dimensional Printing Process", IEEE, 1995, pp. 203-208.

\* cited by examiner

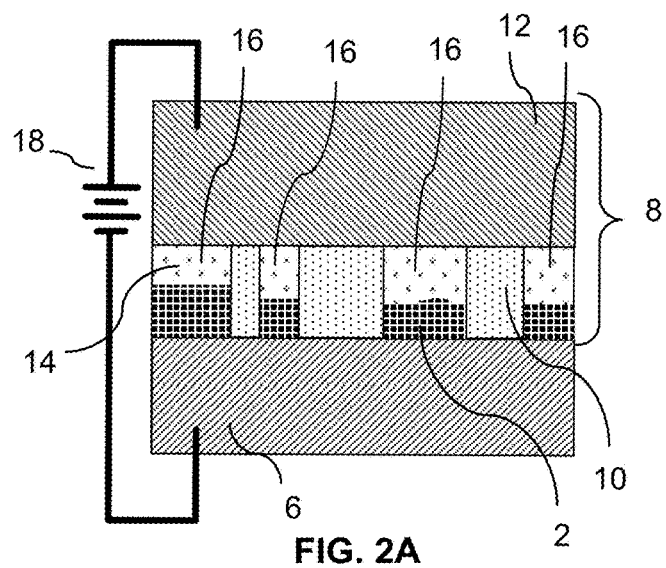
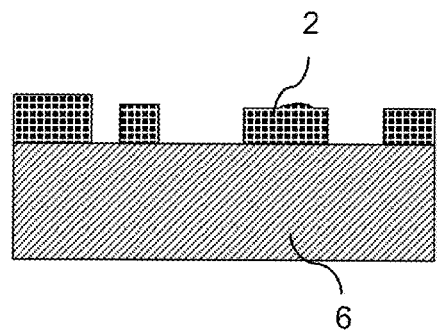
FIG. 2A (PRIOR ART)
FIG. 2B (PRIOR ART)
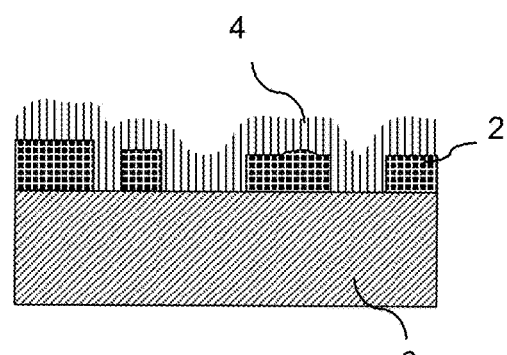
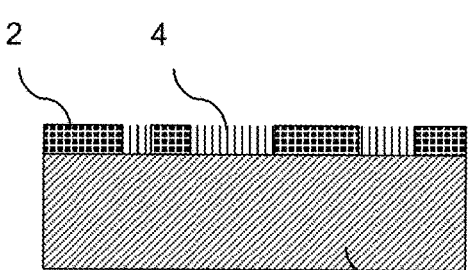
FIG. 2C (PRIOR ART)
FIG. 2D (PRIOR ART)
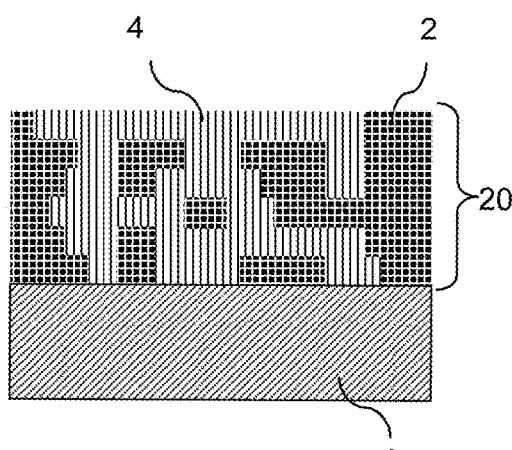
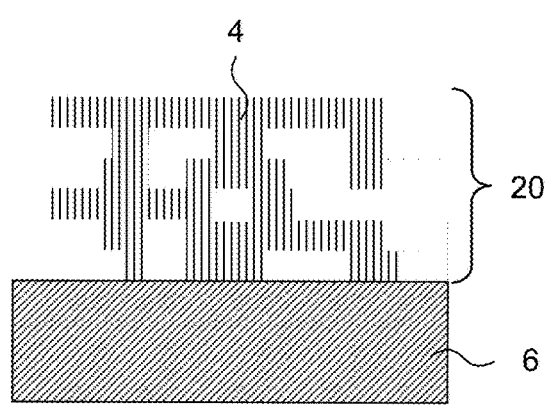
FIG. 2E (PRIOR ART)
FIG. 2F (PRIOR ART)

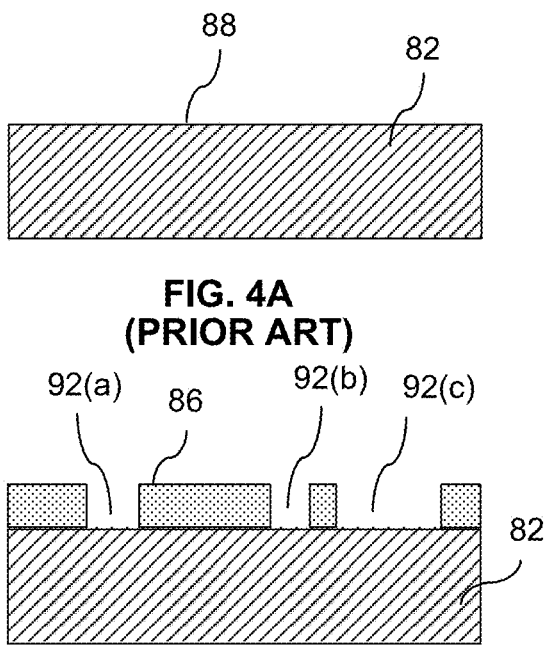
FIG. 4A
(PRIOR ART)
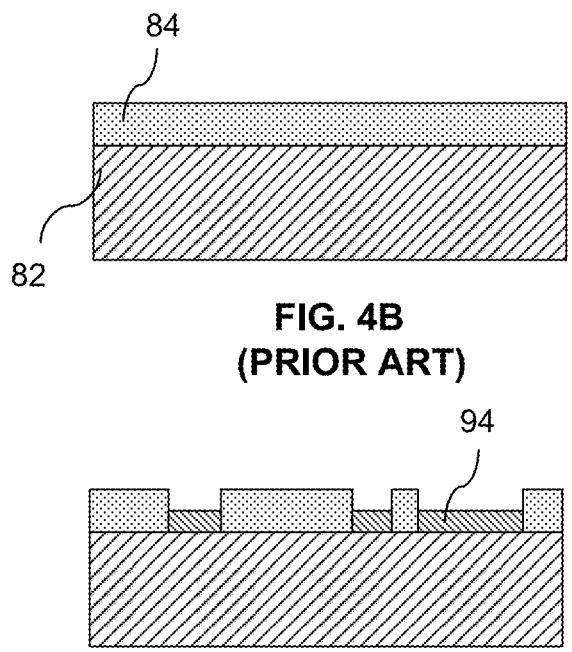
FIG. 4B
(PRIOR ART)
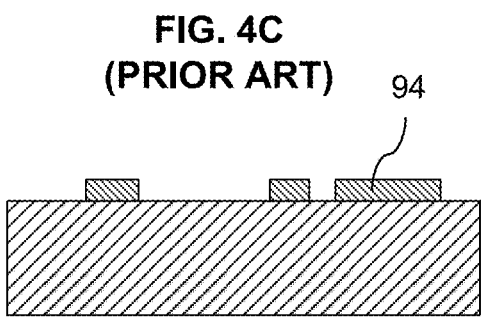
FIG. 4C
(PRIOR ART)
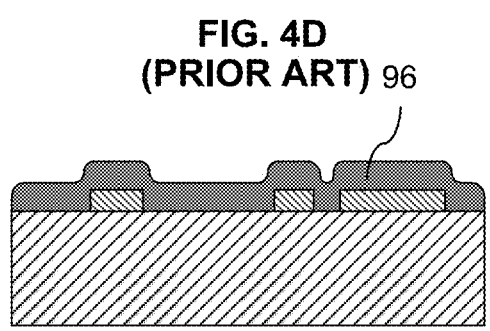
FIG. 4D
(PRIOR ART)
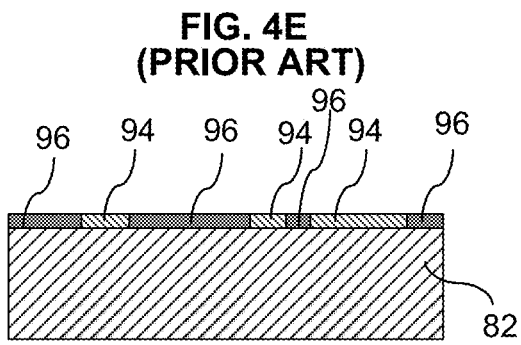
FIG. 4E
(PRIOR ART)
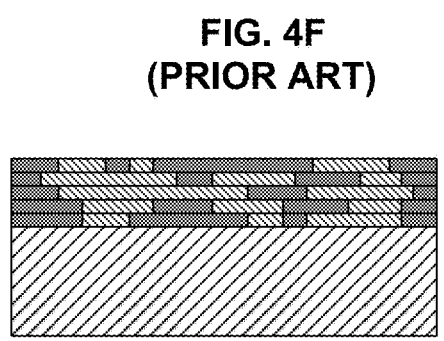
FIG. 4F
(PRIOR ART)
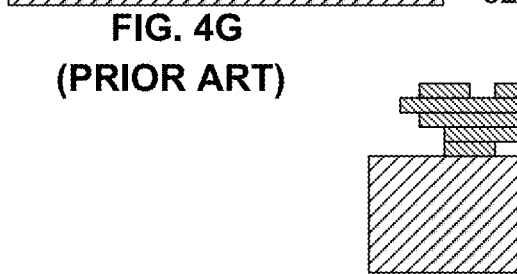
FIG. 4G
(PRIOR ART)
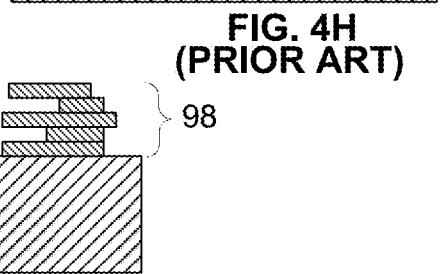
FIG. 4H
(PRIOR ART)
FIG. 4I
(PRIOR ART)

601-A  602-A  603-A

601-B  602-B  603-B

601-C  601-C  603-C

601-D  602-D  603-D

601-E  602-E  603-E

Side Cut View - Middle      End/Cut View - Middle

Side Cut View - Middle      End/Cut View - Middle

Side Cut View - Middle      End/Cut View - Middle

Side Cut View - Middle      End/Cut View - Middle

PROBES HAVING IMPROVED MECHANICAL AND/OR ELECTRICAL PROPERTIES FOR MAKING CONTACT BETWEEN ELECTRONIC CIRCUIT ELEMENTS AND METHODS FOR MAKING

RELATED APPLICATIONS

This application claims the benefit of U.S. Provisional Patent Application No. 62/736,998, filed on Sep. 26, 2018. This referenced application is incorporated herein by reference as if set forth in full herein.

FIELD OF THE INVENTION

The present disclosure relates generally to the field of electrical contacts and more specifically to the field of compliant probes or pins for making electrical contact between electronic circuits (e.g. during wafer level or socket level testing) and even more specifically to such probes or pins formed from a plurality of adhered layers of deposited conductive and possibly dielectric materials and in some embodiments to methods for making such probes or pins using electrochemical, multi-layer, multi-material fabricating methods.

BACKGROUND OF THE INVENTION

Probes:

Numerous electrical contact probe and pin configurations have been commercially used or previously proposed. Examples of such pins, probes, or methods of making are set forth in the following patents and applications. Each of these is incorporated herein by reference as if set forth in full.

| Pat. (USP) or Pub (USAP) or App (USA) # | Title |
| --- | --- |
| U.S. Pat. 7,265,565 | Cantilever Microprobes for Contacting Electronic Components and Methods for Making Such Probes |
| USAP 2008-0111573 | Pin-Type Probes for Contacting Electronic Circuits and Methods for Making Such Probes |
| USAP 2016-0231356 | Multi-Layer, Multi-Material Micro-Scale and Millimeter-Scale Devices with Enhanced Electrical and/or Mechanical Properties |
| U.S. Pat. 9,878,401 | Methods of Forming Parts Using Laser Machining |
| U.S. Pat. 9,540,233 | Methods of Forming Three-Dimensional Structures Having Reduced Stress and/or Curvature |

Electrochemical Fabrication:

An electrochemical fabrication technique for forming three-dimensional structures from a plurality of adhered layers that has been or is being commercially pursued by Microfabrica® Inc. (formerly MEMGen Corporation) of Van Nuys, Calif. under the process names EFAB™ and MICA FREEFORM®.

Various electrochemical fabrication techniques were described in U.S. Pat. No. 6,027,630, issued on Feb. 22, 2000 to Adam Cohen. Some embodiments of this electrochemical fabrication technique allow the selective deposition of a material using a mask that includes a patterned conformable material on a support structure that is independent of the substrate onto which plating will occur. When desiring to perform an electrodeposition using the mask, the conformable portion of the mask is brought into contact with a substrate, but not adhered or bonded to the substrate, while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. such masks have come to be known as INSTANT MASKS™ and the process known as INSTANT MASKING™ or INSTANT MASK™ plating. Selective depositions using conformable contact mask plating may be used to form single selective deposits of material or may be used in a process to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p161, August 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November 1999.

(8) A. Cohen, "Electrochemical Fabrication (EFAB™)", Chapter 19 of The MEMS Handbook, edited by Mohamed Gad-El-Hak, CRC Press, 2002.

(9) Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

An electrochemical deposition process for forming multilayer structures may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate. Typically, this material is either a structural material or a sacrificial material.
2. Then, blanket depositing at least one additional material by electrodeposition so that the additional deposit covers both the regions that were previously selectively deposited onto, and the regions of the substrate that did not receive any previously applied selective depositions. Typically, this material is the other of a structural material or a sacrificial material.
3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to an immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed. The removed material is a sacrificial material while the material that forms part of the desired structure is a structural material.

One method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated (the pattern of conformable material is complementary to the pattern of material to be deposited). In such a process, at least one CC mask is used for each unique cross-sectional pattern that is to be plated.

The support for a CC mask may be a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for multiple CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In some implementations, a single structure, part or device may be formed during execution of the above noted steps or in other implementations (i.e. batch processes) multiple identical or different structures, parts, or devices, may be built up simultaneously.

In preparation for performing the selective deposition of the first operation, the conformable portion of the CC mask is placed in registration with and pressed against a selected portion of (1) the substrate, (2) a previously formed layer, or (3) a previously deposited material forming a portion of a layer that is being formed. The pressing together of the CC mask and relevant substrate, layer, or material occurs in such a way that all openings, in the conformable portions of the CC mask contain plating solution. The conformable material of the CC mask that contacts the substrate, layer, or material acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. One is as a supporting material for the patterned insulator 10 to maintain its integrity and alignment since the pattern may be topologically complex (e.g., involving isolated "islands" of insulator material). The other function is as an anode for the electroplating operation. FIG. 1A also depicts a substrate 6, separated from mask 8, onto which material will be deposited during the process of forming a layer. CC mask plating selectively deposits material 22 onto substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1O.

The CC mask plating process is distinct from a "through-mask" plating process in that in a through-mask plating process the separation of the masking material from the substrate would occur destructively. Furthermore, in a through mask plating process, openings in the masking material are typically formed while the masking material is in contact with and adhered to the substrate. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1G. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the substrate on which plating is to occur (e.g. separate from a three-dimensional (3D) structure that is being formed). CC masks may be formed in a variety of ways, for example, using a photolithographic process. All masks can be generated simultaneously, e.g. prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A illustrates that the passing of current causes material 2 within the plating solution and material 2 from the anode 12 to be selectively transferred to and plated on the substrate 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A—3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source (not shown) for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which feet 68 of subsystem 34 may sit. Subsystem 38 also includes appropriate electrical connections (not shown) for connecting the anode to an appropriate power supply (not shown) for driving the blanket deposition process.

The planarization subsystem 40 is shown in the lower portion of FIG. 3C and includes a lapping plate 52 and associated motion and control systems (not shown) for planarizing the depositions.

In addition to teaching the use of CC masks for electrodeposition purposes, the '630 patent also teaches that the CC masks may be placed against a substrate with the polarity of the voltage reversed and material may thereby be selectively removed from the substrate. It indicates that such removal processes can be used to selectively etch, engrave, and polish a substrate, e.g., a plaque.

The '630 patent further indicates that the electroplating methods and articles disclosed therein allow fabrication of devices from thin layers of materials such as, e.g., metals, polymers, ceramics, and semiconductor materials. It further indicates that although the electroplating embodiments described therein have been described with respect to the use of two metals, a variety of materials, e.g., polymers, ceramics and semiconductor materials, and any number of metals can be deposited either by the electroplating methods therein, or in separate processes that occur throughout the electroplating method. It indicates that a thin plating base can be deposited, e.g., by sputtering, over a deposit that is insufficiently conductive (e.g., an insulating layer) so as to enable subsequent electroplating. It also indicates that multiple support materials (i.e. sacrificial materials) can be included in the electroplated element allowing selective removal of the support materials.

The '630 patent additionally teaches that the electroplating methods disclosed therein can be used to manufacture elements having complex microstructure and close tolerances between parts. An example is given with the aid of FIGS. 14A-14E of that patent. In the example, elements having parts that fit with close tolerances, e.g., having gaps between about 1-5 um, including electroplating the parts of the device in an unassembled, preferably pre-aligned state. In such embodiments, the individual parts can be moved into operational relation with each other or they can simply fall together. Once together the separate parts may be retained by clips or the like.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal Layers". This patent teaches the formation of metal structure utilizing through mask exposures. A first layer of a primary metal is electroplated onto an exposed plating base to fill a void in a photoresist (the photoresist forming a through mask having a desired pattern of openings), the photoresist is then removed, and a secondary metal is electroplated over the first layer and over the plating base. The exposed surface of the secondary metal is then machined down to a height which exposes the first metal to produce a flat uniform surface extending across both the primary and secondary metals. Formation of a second layer may then begin by applying a photoresist over the first layer and patterning it (i.e. to form a second through mask) and then repeating the process that was used to produce the first layer to produce a second layer of desired configuration. The process is repeated until the entire structure is formed, and the secondary metal is removed by etching. The photoresist is formed over the plating base or previous layer by casting and patterning of the photoresist (i.e. voids formed in the photoresist) are formed by exposure of the photoresist through a patterned mask via X-rays or UV radiation and development of the exposed or unexposed areas.

The '637 patent teaches the locating of a plating base onto a substrate in preparation for electroplating materials onto the substrate. The plating base is indicated as typically involving the use of a sputtered film of an adhesive metal, such as chromium or titanium, and then a sputtered film of the metal that is to be plated. It is also taught that the plating base may be applied over an initial layer of sacrificial material (i.e. a layer or coating of a single material) on the substrate so that the structure and substrate may be detached if desired. In such cases after formation of the structure the sacrificial material forming part of each layer of the structure may be removed along with the initial sacrificial layer to free the structure. Substrate materials mentioned in the '637 patent include silicon, glass, metals, and silicon with protected semiconductor devices. A specific example of a plating base includes about 150 angstroms of titanium and about 300 angstroms of nickel, both of which are sputtered at a temperature of 160° C. In another example, it is indicated that the plating base may consist of 150 angstroms of titanium and 150 angstroms of nickel where both are applied by sputtering.

Electrochemical Fabrication provides the ability to form prototypes and commercial quantities of miniature objects, parts, structures, devices, and the like at reasonable costs and in reasonable times. In fact, Electrochemical Fabrication is an enabler for the formation of many structures that were hitherto impossible to produce. Electrochemical Fabrication opens the spectrum for new designs and products in many industrial fields. Even though Electrochemical Fabrication offers this new capability and it is understood that Electrochemical Fabrication techniques can be combined with designs and structures known within various fields to produce new structures, certain uses for Electrochemical Fabrication provide designs, structures, capabilities and/or features not known or obvious in view of the state of the art.

A need exists in various fields, including the field of electronic device testing (e.g. testing of integrated circuits at the wafer level, packaged integrated circuits, passive electronic devices prior to packaging, and passive electronic devices after packaging) for miniature devices (e.g. spring probes) having improved characteristics, reduced fabrication times, reduced fabrication costs, simplified fabrication processes, greater versatility in device design, improved selection of materials, improved material properties, more cost effective and less risky production of such devices, and/or more independence between geometric configuration and the selected fabrication process.

SUMMARY OF THE INVENTION

It is an object of some embodiments of the invention to provide a contact probe with improved electrical properties.

It is an object of some embodiments of the invention to provide a contact probe with improved mechanical properties.

It is an object of some embodiments of the invention to provide methods for fabricating improved probe structures.

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively may address some other object ascertained from the teachings herein. It is not necessarily intended that all objects be addressed by any single aspect of the invention even though that may be the case regarding some aspects.

In a first aspect of the invention, a compliant probe for providing an elastic electrical connection between at least two electronic components, includes: (a) a first planarized layer including at least a first structural material; (b) a second planarized layer including at least a second structural material, wherein the second structural material has a relationship with the first planarized layer selected from the group consisting of: (1) the second structural material is directly adhered to the first planarized layer, (2) the second structural material is separated from the first planarized layer by one or more intermediate planarized layers, and (3) the second material is separated from the first planarized layer by one or more depositions of at least one intervening material; (c) a third planarized layer including at least a third structural material, wherein the third structural material has a relationship with the second planarized layer selected from the group consisting of: (1) the third material is directly adhered to the second planarized layer, (2) the third material is separated from the second planarized layer by one or more additional intermediate planarized layers, and (3) the third material is separated from the second planarized layer by one or more depositions of at least one intervening material, wherein the second planarized layer is located between the first and third planarized layers in a layer stacking direction, wherein the second structural material is different from the first structural material and the second structural material is different from the third structural material, wherein the probe is configured to provide an elastic electrical contact element that provides a conductive path along a length of the probe between at least two electronic components, and wherein each of at least one of the first to third planarized layers includes at least one core structural material and at least one shell structural material, wherein the at least one of the core structural material and the at least one shell structural material of a respective layer corresponds to the respective structural material selected from the group consisting of the first structural material, second structural material, and third structural material while the other of the at least one shell structural material and at least one core structural material is a different material, and wherein the core structural material is laterally surrounded by structural material that is not core structural material on the respective layer and wherein the core structural material extends at least a portion of the axial length of the probe and has a location selected from the group consisting of: (1) the core has a length extending in an axial (i.e. longitudinal) direction of the probe in the given layer and a center of the core, as measured perpendicular to the local axis (i.e. local longitudinal direction) of the probe, along a majority of the length of the core in the given layer is offset to a given side of a center line of the probe in the given layer; (2) the core has a core length in a given layer extending in an axial (i.e. longitudinal) direction of the probe within the given layer and the core has a width in the given layer with a first edge (e.g. a left edge or a right edge) and a second edge (e.g. the other of a right edge or left edge) and wherein the first edge of the core is spaced from a first edge of the probe by a first distance, and wherein the second edge of the core is spaced from a second edge of the probe by a second distance, wherein the probe has probe width, and wherein the first distance is different from the second distance, wherein the probe width, the first distance, and the second distance are measured along at least one common measurement line that extends perpendicular to a local axial direction of the probe in a location where the at least one measurement line crosses a centerline of the probe; and (3) the core has a length extending in an axial (i.e. longitudinal) direction of the probe and has a first edge (e.g. on the left or the right) and a second edge (e.g. on the other of the right or left), wherein the probe has first edge and a second edge corresponding with the first and second edges of the core, respectively, and wherein the first edge of the core is closer to the first edge of the probe than is the second edge of the core and wherein, along at least a portion of the length of the core, the second edge of the core is closer to the first edge of the probe than to the second edge of the probe.

In a second aspect of the invention, a compliant probe for providing an elastic electrical connection between at least two electronic components, includes: (a) a first planarized layer including at least a first structural material; (b) a second planarized layer including at least a second structural material, wherein the second structural material has a relationship with the first planarized layer selected from the group consisting of: (1) the second structural material is directly adhered to the first planarized layer, (2) the second structural material is separated from the first planarized layer by one or more intermediate planarized layers, and (3) the second material is separated from the first planarized layer by one or more depositions of at least one intervening material; (c) a third planarized layer including at least a third structural material, wherein the third structural material has a relationship with the second planarized layer selected from the group consisting of: (1) the third material is directly adhered to the second planarized layer, (2) the third material is separated from the second planarized layer by one or more additional intermediate planarized layers, and (3) the third material is separated from the second planarized layer by one or more depositions of at least one intervening material, wherein the second planarized layer is located between the first and third planarized layers in a layer stacking direction, wherein the second structural material is different from the first structural material and the second structural material is different from the third structural material, wherein the probe is configured to provide an elastic electrical contact element that provides a conductive path along a length of the probe between at least two electronic components, and wherein each of at least one of the first to third planarized layers includes at least one exposed core structural material and at least one shell structural material, wherein the at least one of the exposed core structural material and the at least one shell structural material of a respective layer corresponds to the respective structural material selected from the group consisting of the first structural material, second structural material, and third structural material while the other of the shell structural material and exposed core structural material is a different material, and wherein the exposed core structural material is completely laterally bounded along one edge, selected from the group consisting of the left and right edges, by non-core structural material and is no more than partially bounded by non-core structural material along an opposite edge such that exposed core material forms at least a portion of one layered edge of the probe and wherein the core structural material extents at least a portion of an axial length of the probe.

Numerous variations of the first and second aspects of the invention are possible and include for example: (1) the core structural material is also bounded from above and below along a layer stacking direction by non-core structural material; (2) variation 1 wherein the encapsulation from above and below is direct encapsulation with the core structural material of the respective layer being covered by non-core structural material of an immediately succeeding layer and by an immediately preceding layer; (3) variation 1 wherein the encapsulation from above and below is indirect encapsulation as the core structural material of the respective layer is separated from non-core material by at least one additional layer of core material forming part of a layer selected from the group consisting of (a) at least one immediately preceding layer, (b) at least one immediately succeeding layer, and (c) at least one immediately preceding layer and at least one immediately succeeding layer; (4) a contact tip material located at an end of at least one of the layers, wherein the tip material is different from the first, second, and third materials; (5) any of variations 1-3 wherein a contact tip material located at an end of at least one of the layers, wherein the tip material is different from the first, second, and third materials; (6) the first and third materials include the same material; (7) any of variations 1-5 wherein the first and third materials include the same material; (8) the core material includes a dielectric material; (9) any of variations 1-7 wherein the core material includes a dielectric material; (10) the core material includes a conductive material having a higher conductivity than at least one of the first, second, and third materials; (11) any of variations 1-5 wherein the core material includes a conductive material having a higher conductivity than at least one of the first, second, and third materials; (12) variations 10-11 wherein the core material includes a conductive material having a higher conductivity than each of the first, second and third materials; (13) the core material includes copper; (14) any of variations 1-11 wherein the core material includes copper; (15) the at least one of the first, second, and third materials includes a material selected from the group consisting of: (a) nickel (Ni), (b) copper (Cu), (c) beryllium copper (BeCu), (d) nickel phosphorous (Ni—P), (e) nickel cobalt (NiCo), (f) aluminum copper (Al—Cu), (g) steel, (h) P7 alloy, (i) palladium (Pd), (j) palladium cobalt (PdCo), (k) molybdenum, (l) manganese, (m) brass, (n) chrome, (o) chromium copper (p), and (q) tungsten (W), and (r) a combination of at least two of these materials; (16) any of variations 1-9 wherein the at least one of the first, second, and third materials includes a material selected from the group consisting of: (a) nickel (Ni), (b) copper (Cu), (c) beryllium copper (BeCu), (d) nickel phosphorous (Ni—P), (e) nickel cobalt (NiCo), (f) aluminum copper (Al—Cu), (g) steel, (h) P7 alloy, (i) palladium (Pd), (j) palladium cobalt (PdCo), (k) molybdenum, (l) manganese, (m) brass, (n) chrome, (o) chromium copper (p), and (q) tungsten (W), and (r) a combination of at least two of these materials; (17) the second planarized layer includes a shell structural material and a core structural material and wherein the first and third structural materials and the shell structural material of the second planarized layer include the same material; (18) any of variations 1-11 wherein the second planarized layer includes a shell structural material and a core structural material and wherein the first and third structural materials and the shell structural material of the second planarized layer include the same material; and (19) variations 4-5 wherein the contact tip material includes a metal different from any core structural material.

Additional variations of the first and second aspects of the invention are possible and include for example: (20) a conformal coating material located on at least portions of the first, second and third planarized layers; (21) any of variations 1-19 wherein a conformal coating material located on at least portions of the first, second and third planarized layers; (22) variations 20-21 wherein the conformal coating material includes a dielectric; (23) variations 20-21 wherein the conformal coating material includes a conductive material; (24) the first, second, third, and any intermediate layers includes a number of layers selected from the group consisting of (a) at least 4 layers, (b) at least 5 layers, and (c) at least 6 layers; (25) any of variations 1-23 wherein the first, second, third, and any intermediate layers includes a number of layers selected from the group consisting of (a) at least 4 layers, (b) at least 5 layers, and (c) at least 6 layers; (26) the probe includes at least two layers with cores and shells wherein the at least two layers are separated by at least one intervening layer; (27) any of variations 1-25 wherein the probe includes at least two layers with cores and shells wherein the at least two layers are separated by at least one intervening layer; (28) the probe includes at least two layers with cores and shells wherein the at least two layers are joined one to the other; (29) any of variations 1-25 wherein the probe includes at least two layers with cores and shells wherein the at least two layers are joined one to the other; (30) at least one shell and corresponding core being formed by a process selected from the group consisting of: (a) using a first mask to form a configuration of shell structural material and then blanket plating to form a configuration of the core structural material; (b) using a first mask to form a configuration of the shell structural material and a second mask to form a configuration of the core structural material; (c) using a first mask to form a configuration of the core structural material and a second mask to form a configuration of the shell structural material; (d) use a first deposit of conductive material to form a pattern into which a thin layer of structural shell material can be formed with both a base region and sidewall regions and then using a deposition to deposit a configuration of core material followed by planarization to set a common level for core structural material and the shell structural material; (e) using a mask to deposit a configuration of core structural material to a height less than a thickness of the layer, and thereafter blanket depositing a shell structural material and then planarizing to set a height for the layer wherein shell structural material caps the core structural material; (f) using a mask to deposit a configuration of core structural material to a height greater than a thickness of the layer, and thereafter blanket depositing a shell structural material and then planarizing to set a height for the layer wherein the core structural material and the shell structural material are trimmed to a substantially common level; (31) any of variations 1-29 wherein at least one shell and corresponding core are formed by a process selected from the group consisting of: (a) using a first mask to form a configuration of shell structural material and then blanket plating to form a configuration of the core structural material; (b) using a first mask to form a configuration of the shell structural material and a second mask to form a configuration of the core structural material; (c) using a first mask to form a configuration of the core structural material and a second mask to form a configuration of the shell structural material; (d) use a first deposit of conductive material to form a pattern into which a thin layer of structural shell material can be formed with both a base region and sidewall regions and then using a deposition to deposit a configuration of core material followed by planarization to set a common level for core structural material and the shell structural material; (e) using a mask to deposit a configuration of core structural material to a height less than a thickness of the layer, and thereafter blanket depositing a shell structural material and then planarizing to set a height for the layer wherein shell structural material caps the core structural material; (f) using a mask to deposit a configuration of core structural material to a height greater than a thickness of the layer, and thereafter blanket depositing a shell structural material and then planarizing to set a height for the layer wherein the core structural material and the shell structural material are trimmed to a substantially common level; (32) the core has a length extending in an axial direction of the probe in the given layer and a center of the core, as measured perpendicular to the local axis of the probe, along a majority of the length of the core in the given layer is offset to a given side of a center line of the probe in the given layer; (33) any of variations 1-31 wherein the core has a length extending in an axial direction of the probe in the given layer and a center of the core, as measured perpendicular to the local axis of the probe, along a majority of the length of the core in the given layer is offset to a given side of a center line of the probe in the given layer; (34) variations 32-33 wherein the core structural material has a first coefficient of thermal expansion and the shell structural material has a second coefficient of thermal expansion wherein the first coefficient is larger than the second coefficient; (35) variations 32-33 wherein the core structural material has a first coefficient of thermal expansion and the shell structural material has a second coefficient of thermal expansion wherein the first coefficient is smaller than the second coefficient; (36) any of variations 32-35 wherein the core is shifted from a center line of the probe toward a net direction of curvature of the probe; (37) variation 36 has it depends from variation 34 wherein upon current flow through the probe, the probe undergoes an enhanced stress, compared to that from a similar probe without a shifted core, that exerts a force on the probe tip that is in a direction opposed to that of the direction of curvature; (38) variation 36 as it depends from variation 35 wherein upon current flow through the probe, the probe undergoes an enhanced stress, compared to that from a similar probe without a shifted core, that exerts a force on the probe tip that is in a direction similar to that of the direction of curvature; and (39) any of variations 32-35 wherein the core is shifted from a center line of the probe away from a net direction of curvature of the probe.

Additional variations of the first and second aspects of the invention are possible and include for example: (40) variation 39 as it depends from variation 34 wherein upon usage the probe undergoes an enhanced stress, compared to that from a similar probe without a shifted core, that exerts a force on a probe tip that is in a direction similar to that of the direction of curvature; (41) variation 39 as it depends from variation 35 wherein upon usage the probe undergoes an enhanced stress, compared to that from a similar probe without a shifted core, that exerts a force on a probe tip that is in a direction opposed to that of the direction of curvature; (42) any of variations 32-41 wherein the core has a parameter selected from the group consisting of: (a) the offset extends along the length by an amount selected from the group consisting of: (i)>=9/16 of the core length, (ii)>=5/8 of the core length, (iii)>=11/16 of the core length, (iv)>=3/4 of the core length, (v)>=7/8 of the core length, and (vi)=the length of the probe; (b) the offset has an average magnitude selected from the group consisting of: (i)>=1/16 of the probe width, (ii)>=1/8 of the probe width, (iii)>=1/4 of the probe width, and (iv)>=3/8 of the probe width; (c) the core has a core width selected from the group consisting of: (i) the core width is substantially constant along the length of the core, (ii) the core width varies along its length by a ratio of maximum width to minimum width selected from the group consisting of: a)<=8, b)<=4, c)<=2, d)>=2, e)>=4, and f)>=8; (iii) the core width, measured as a ratio of core width to probe width, is selected from the group consisting of: a)>=3/4, b)>=5/8, c)>=1/2, d)>=1/4, e)<=3/4, f)<=5/8, g)<=1/2, h)<=1/4, and i)<=1/8; (iv) at least 1 micron, (v) at least 3 microns, (vi) at least 5 microns, and (vii) at least 7 microns; (43) any of variations 32-42 wherein the at least one shell structural material on a given layer has a width on either side of the core, along a line perpendicular to as axis of the probe, of (a) at least one micron, (b) at least 3 microns, (c) at least 5 microns, (d) at least 7 microns, (e) at least 5% of the probe width on the given layer along the line, (f) at least 10% of the probe width on the given layer along the line, (g) at least 20% of the probe width on the given layer along the line, (h) no more than 40% of the probe width on the given layer along the line, (i) no more than 30% of the probe width on the given layer along the line, and (j) no more than 20% of the probe width on the given layer along the line; (44) any of variations 32-43 wherein core structural material and non-core structural material exists on at least two consecutive layers wherein the core material on the two consecutive layers has a core-core radial overlap (overlap along a line within a layer and perpendicular to an axis of the probe) selected from the group consisting of (a) at least one micron, (b) at least 3 microns, (c) at least 5 microns, (d) at least 7 microns, (e) at least 5% of the probe width, (f) at least 10% of the probe width, (g) at least 20% of the probe width, (h) at least 40% of the probe width, (i) no more than 30% of the probe width, and (j) no more than 20% of the probe width; (45) the core has a core length in a given layer extending in an axial direction of the probe within the given layer and the core has a width in the given layer with a first edge (e.g. a left edge or a right edge) and a second edge (e.g. the other of a right edge or left edge) and wherein the first edge of the core is spaced from a first edge of the probe by a first distance, and wherein the second edge of the core is spaced from a second edge of the probe by a second distance, wherein the probe has probe width, and wherein the first distance is different from the second distance, wherein the probe width, the first distance, and the second distance are measured along at least one common measurement line that extends perpendicular to a local axial direction of the probe in a location where the at least one measurement line crosses a centerline of the probe; (46) any of variations 1-31 wherein the core has a core length in a given layer extending in an axial direction of the probe within the given layer and the core has a width in the given layer with a first edge (e.g. a left edge or a right edge) and a second edge (e.g. the other of a right edge or left edge) and wherein the first edge of the core is spaced from a first edge of the probe by a first distance, and wherein the second edge of the core is spaced from a second edge of the probe by a second distance, wherein the probe has probe width, and wherein the first distance is different from the second distance, wherein the probe width, the first distance, and the second distance are measured along at least one common measurement line that extends perpendicular to a local axial direction of the probe in a location where the at least one measurement line crosses a centerline of the probe; (47) variations 45-46 wherein the core structural material has a first coefficient of thermal expansion and the shell structural material has a second coefficient of thermal expansion wherein the first coefficient is larger than the second coefficient; (48) variations 45-46 wherein the core structural material has a first coefficient of thermal expansion and the shell structural material has a second coefficient of thermal expansion wherein the first coefficient is smaller than the second coefficient; (49) any of variations 45-48 wherein the probe has a net curvature in the first direction and wherein the first distance is smaller than the second distance; (50) variation 49 as it depends from variation 47 wherein upon current flow through the probe, the probe undergoes an enhanced stress, compared to that from a similar probe where the first and second distances are equal, that exerts a force on the probe tip that is in a direction opposed to that of the direction of curvature; (51) variation 49 as it depends from variation 48 wherein upon current flow through the probe, the probe undergoes an enhanced stress, compared to that from a similar probe where the first and second distances are equal, that exerts a force on the probe tip that is in a direction similar to that of the direction of curvature; (52) any of variations 45-48 wherein the core has a net curvature in the first direction and wherein the first distance is larger than the second distance; (53) variation 52 as it depends from 47 wherein upon current flow, the probe undergoes an enhanced stress, compared to that from a similar probe where the first and second distances are equal, that exerts a force on a probe tip that is in a direction similar to that of the direction of curvature; (54) variation 52 as it depends from 48 wherein upon current flow, the prove undergoes an enhanced stress, compared to that from a similar probe where the first and second distances are equal, that exerts a force on a probe tip that is in a direction opposed to that of the direction of curvature; (55) any of variations 45-54 wherein the core has a parameter selected from the group consisting of: (a) a non-zero difference between the first and second distances extends along a length by an amount selected from the group consisting of: (i)>9/16 of the core length, (ii)>5/8 of the core length, (iii)>11/16 of the core length, (iv)>3/4 of the core length, (v)>7/8 of the core length, and (vi)=the core length; (b) a difference between the first and second distances has an average magnitude selected from the group consisting of: (i)>=1/16 of the probe width, (ii)>=1/8 of the probe width, (iii)>=1/4 of the probe width, and (iv)>=3/8 of the probe width, (v)>=1/2 of the probe width, (c) the core width is selected from the group consisting of: (i) the core width is substantially constant along the length of the core, (ii) the core width varies along its length by a ratio of maximum width to minimum width selected from the group consisting of: (a)<=8, (b)<=4, (c)<=2, (d)>=2, (e)>=4, and (f)>=8; (iii) the core width, measured as a ratio of core width to probe width, is selected from the group consisting of: (a)>=3/4, (b)>=5/8, (c)>=1/2, (d)>=1/4, (e)<=3/4, (f)<=5/8, (g)<=1/2, (h)<=1/4, and (i)<=1/8; (iv) at least 1 micron, (v) at least 3 microns, (vi) at least 5 microns, (vii) at least 7 microns; (56) any of variations 45-55 wherein the at least one shell structural material on a given layer has a width on either side of the core, along a line perpendicular to as axis of the probe, of (a) at least one micron, (b) at least 3 microns, (c) at least 5 microns, (d) at least 7 microns, (e) at least 5% of the probe width on the given layer along the line, (f) at least 10% of the probe width on the given layer along the line, (g) at least 20% of the probe width on the given layer along the line, (h) no more than 40% of the probe width on the given layer along the line, (i) no more than 30% of the probe width on the given layer along the line, and (j) no more than 20% of the probe width on the given layer along the line; (57) any of variations 45-56 wherein core structural material and non-core structural material exists on at least two consecutive layers wherein the core material on the two consecutive layers has a core-core radial overlap (overlap along a line within a layer and perpendicular to an axis of the probe) selected from the group consisting of (a) at least one micron, (b) at least 3 microns, (c) at least 5 microns, (d) at least 7 microns, (e) at least 5% of the probe width, (f) at least 10% of the probe width, (g) at least 20% of the probe width, (h) at least 40% of the probe width, (i) no more than 30% of the probe width, and (j) no more than 20% of the probe width; (58) the core has a length extending in an axial direction of the probe and has a first edge (e.g. on the left or the right) and a second edge (e.g. on the other of the right or left), wherein the probe has first edge and a second edge corresponding with the first and second edges of the core, respectively, and wherein the first edge of the core is closer to the first edge of the probe than is the second edge of the core and wherein, along at least a portion of the length of the core, the second edge of the core is closer to the first edge of the probe than to the second edge of the probe; and (59) any of variations 1-31 wherein the core has a length extending in an axial direction of the probe and has a first edge (e.g. on the left or the right) and a second edge (e.g. on the other of the right or left), wherein the probe has first edge and a second edge corresponding with the first and second edges of the core, respectively, and wherein the first edge of the core is closer to the first edge of the probe than is the second edge of the core and wherein, along at least a portion of the length of the core, the second edge of the core is closer to the first edge of the probe than to the second edge of the probe.

Additional variations of the first and second aspects of the invention are possible and include for example: (60) variations 58-59 wherein the core structural material has a first coefficient of thermal expansion and the shell structural material has a second coefficient of thermal expansion wherein the first coefficient is larger than the second coefficient; (61) variations 58-59 wherein the core structural material has a first coefficient of thermal expansion and the shell structural material has a second coefficient of thermal expansion wherein the first coefficient is smaller than the second coefficient; (62) any of variations 58-61 wherein the probe has a net curvature in toward a first edge of the probe; (63) variation 62 as it depends from 60 wherein upon current flow through the probe, the probe undergoes an enhanced stress, compared to that from a similar probe where the first and second distances are equal, that exerts a force on the probe tip that is in a direction opposed to that of the direction of curvature; (64) variation 62 as it depends from 61 wherein upon current flow through the probe, the probe undergoes an enhanced stress, compared to that from a similar probe where the first and second distances are equal, that exerts a force on the probe tip that is in a direction similar to that of the direction of curvature; (65) any of variations 58-61 wherein the core has a net curvature toward a second edge of the probe; (66) variation 65 as it depends from 60 wherein upon current flow, the probe undergoes an enhanced stress, compared to that from a similar probe where the first and second distances are equal, that exerts a force on a probe tip that is in a direction similar to that of the direction of curvature; (67) variation 65 as it depends from 61 wherein upon current flow, the probe undergoes an enhanced stress, compared to that from a similar probe where the first and second distances are equal, that exerts a force on a probe tip that is in a direction opposed to that of the direction of curvature; (68) any of variations 58-67 wherein the core has a parameter selected from the group consisting of: (a) a length of the core, along which the second edge of the core is closer to the first edge of the probe than the second edge of the probe, is selected from the group consisting of: (i)>9/16 of the core length, (ii)>5/8 of the core length, (iii)>11/16 of the core length, (iv)>3/4 of the core length, (v)>7/8 of the core length, and (vi)=the core length; (b) the core width is selected from the group consisting of: (i) the core width is substantially constant along the length of the core, (ii) the core width varies along its length by a ratio of maximum width to minimum width selected from the group consisting of: (a)<=8, (b)<=4, (c)<=2, (d)>=2, (e)>=4, and (f)>=8; (iii) the core width, measured as a ratio of core width to probe width, is selected from the group consisting of: (a)>=3/4, (b)>=5/8, (c)>=1/2, (d)>=1/4, (e)<=3/4, (f)<=5/8, (g)<=1/2, (h)<=1/4, and (i)<=1/8; (iv) at least 1 micron, (v) at least 3 microns, (vi) at least 5 microns, (vii) at least 7 microns; (69) any of variations 58-68 wherein the at least one shell structural material on a given layer has a width on either side of the core, along a line perpendicular to as axis of the probe, of (a) at least one micron, (b) at least 3 microns, (c) at least 5 microns, (d) at least 7 microns, (e) at least 5% of the probe width on the given layer along the line, (f) at least 10% of the probe width on the given layer along the line, (g) at least 20% of the probe width on the given layer along the line, (h) no more than 40% of the probe width on the given layer along the line, (i) no more than 30% of the probe width on the given layer along the line, and (j) no more than 20% of the probe width on the given layer along the line; and (70) any of variations 58-69 wherein core structural material and non-core structural material exists on at least two consecutive layers wherein the core material on the two consecutive layers has a core-core radial overlap (overlap along a line within a layer and perpendicular to an axis of the probe) selected from the group consisting of (a) at least one micron, (b) at least 3 microns, (c) at least 5 microns, (d) at least 7 microns, (e) at least 5% of the probe width, (f) at least 10% of the probe width, (g) at least 20% of the probe width, (h) at least 40% of the probe width, (i) no more than 30% of the probe width, and (j) no more than 20% of the probe width.

In a third aspect of the invention, a method for forming a compliant probe for providing an elastic electrical connection between at least two electronic components, includes: (a) forming a first planarized layer including at least a first structural material; (b) forming a second planarized layer including at least a second structural material, wherein the second structural material has a relationship with the first planarized layer selected from the group consisting of: (1) the second structural material is directly adhered to the first planarized layer, (2) the second structural material is separated from the first planarized layer by one or more intermediate planarized layers, and (3) the second material is separated from the first planarized layer by one or more depositions of at least one intervening material; (c) forming a third planarized layer including at least a third structural material, wherein the third structural material has a relationship with the second planarized layer selected from the group consisting of: (1) the third material is directly adhered to the second planarized layer, (2) the third material is separated from the second planarized layer by one or more additional intermediate planarized layers, and (3) the third material is separated from the second planarized layer by one or more depositions of at least one intervening material, wherein the second planarized layer is located between the first and third planarized layers in a layer stacking direction, wherein the second structural material is different from the first structural material and the second structural material is different from the third structural material, wherein the probe is configured to provide an elastic electrical contact element that provides a conductive path along a length of the probe between at least two electronic components, and wherein each of at least one of the first to third planarized layers includes at least one core structural material and at least one shell structural material, wherein the at least one of the core structural material and the at least one shell structural material of a respective layer corresponds to the respective structural material selected from the group consisting of the first structural material, second structural material, and third structural material while the other of the at least one shell structural material and at least one core structural material is a different material, and wherein the core structural material is laterally surrounded by structural material that is not core structural material on the respective layer and wherein the core structural material extends at least a portion of the axial length of the probe and has a location selected from the group consisting of: (1) the core has a length extending in an axial direction of the probe in the given layer and a center of the core, as measured perpendicular to the local axis of the probe, along a majority of the length of the core in the given layer is offset to a given side of a center line of the probe in the given layer; (2) the core has a core length in a given layer extending in an axial direction of the probe within the given layer and the core has a width in the given layer with a first edge (e.g. a left edge or a right edge) and a second edge (e.g. the other of a right edge or left edge) and wherein the first edge of the core is spaced from a first edge of the probe by a first distance, and wherein the second edge of the core is spaced from a second edge of the probe by a second distance, wherein the probe has probe width, and wherein the first distance is different from the second distance, wherein the probe width, the first distance, and the second distance are measured along at least one common measurement line that extends perpendicular to a local axial direction of the probe in a location where the at least one measurement line crosses a centerline of the probe; and (3) the core has a length extending in an axial direction of the probe and has a first edge (e.g. on the left or the right) and a second edge (e.g. on the other of the right or left), wherein the probe has first edge and a second edge corresponding with the first and second edges of the core, respectively, and wherein the first edge of the core is closer to the first edge of the probe than is the second edge of the core and wherein, along at least a portion of the length of the core, the second edge of the core is closer to the first edge of the probe than to the second edge of the probe.

A variation of the third aspect of the invention is possible and includes for example: (1) at least one shell and corresponding core being formed by a process selected from the group consisting of: (a) using a first mask to form a configuration of shell structural material and then blanket plating to form a configuration of the core structural material; (b) using a first mask to form a configuration of the shell structural material and a second mask to form a configuration of the core structural material; (c) using a first mask to form a configuration of the core structural material and a second mask to form a configuration of the shell structural material; (d) use a first deposit of conductive material to form a pattern into which a thin layer of structural shell material can be formed with both a base region and sidewall regions and then using a deposition to deposit a configuration of core material followed by planarization to set a common level for core structural material and the shell structural material; (e) using a mask to deposit a configuration of core structural material to a height less than a thickness of the layer, and thereafter blanket depositing a shell structural material and then planarizing to set a height for the layer wherein shell structural material caps the core structural material; (f) using a mask to deposit a configuration of core structural material to a height greater than a thickness of the layer, and thereafter blanket depositing a shell structural material and then planarizing to set a height for the layer wherein the core structural material and the shell structural material are trimmed to a substantially common level.

In a fourth aspect of the invention, a method for forming a compliant probe for providing an elastic electrical connection between at least two electronic components, includes: (a) forming a first planarized layer including at least a first structural material; (b) forming a second planarized layer including at least a second structural material, wherein the second structural material has a relationship with the first planarized layer selected from the group consisting of: (1) the second structural material is directly adhered to the first planarized layer, (2) the second structural material is separated from the first planarized layer by one or more intermediate planarized layers, and (3) the second material is separated from the first planarized layer by one or more depositions of at least one intervening material; (c) forming a third planarized layer including at least a third structural material, wherein the third structural material has a relationship with the second planarized layer selected from the group consisting of: (1) the third material is directly adhered to the second planarized layer, (2) the third material is separated from the second planarized layer by one or more additional intermediate planarized layers, and (3) the third material is separated from the second planarized layer by one or more depositions of at least one intervening material, wherein the second planarized layer is located between the first and third planarized layers in a layer stacking direction, wherein the second structural material is different from the first structural material and the second structural material is different from the third structural material, wherein the probe is configured to provide an elastic electrical contact element that provides a conductive path along a length of the probe between at least two electronic components, and wherein each of at least one of the first to third planarized layers includes at least one exposed core structural material and at least one shell structural material, wherein the at least one of the exposed core structural material and the at least one shell structural material of a respective layer corresponds to the respective structural material selected from the group consisting of the first structural material, second structural material, and third structural material while the other of the shell structural material and exposed core structural material is a different material, and wherein the exposed core structural material is completely laterally bounded along one edge, selected from the group consisting of the left and right edges, by non-core structural material and is no more than partially bounded by non-core structural material along an opposite edge such that exposed core material forms at least a portion of one layered edge of the probe and wherein the core structural material extents at least a portion of an axial length of the probe.

A variation of the fourth aspect of the invention is possible and includes for example: (1) at least one shell and corresponding core being formed by a process selected from the group consisting of: (a) using a first mask to form a configuration of shell structural material and then blanket plating to form a configuration of the core structural material; (b) using a first mask to form a configuration of the shell structural material and a second mask to form a configuration of the core structural material; (c) using a first mask to form a configuration of the core structural material and a second mask to form a configuration of the shell structural material; (d) use a first deposit of conductive material to form a pattern into which a thin layer of structural shell material can be formed with both a base region and sidewall regions and then using a deposition to deposit a configuration of core material followed by planarization to set a common level for core structural material and the shell structural material; (e) using a mask to deposit a configuration of core structural material to a height less than a thickness of the layer, and thereafter blanket depositing a shell structural material and then planarizing to set a height for the layer wherein shell structural material caps the core structural material; (f) using a mask to deposit a configuration of core structural material to a height greater than a thickness of the layer, and thereafter blanket depositing a shell structural material and then planarizing to set a height for the layer wherein the core structural material and the shell structural material are trimmed to a substantially common level.

In a fifth aspect of the invention, a structure, includes: (a) a first planarized layer including at least a first structural material; (b) a second planarized layer including at least a second structural material, wherein the second structural material has a relationship with the first planarized layer selected from the group consisting of: (1) the second structural material is directly adhered to the first planarized layer, (2) the second structural material is separated from the first planarized layer by one or more intermediate planarized layers, and (3) the second material is separated from the first planarized layer by one or more depositions of at least one intervening material; (c) a third planarized layer including at least a third structural material, wherein the third structural material has a relationship with the second planarized layer selected from the group consisting of: (1) the third material is directly adhered to the second planarized layer, (2) the third material is separated from the second planarized layer by one or more additional intermediate planarized layers, and (3) the third material is separated from the second planarized layer by one or more depositions of at least one intervening material, wherein the second planarized layer is located between the first and third planarized layers in a layer stacking direction, wherein the second structural material is different from the first structural material and the second structural material is different from the third structural material, and wherein each of at least one of the first to third planarized layers includes at least one core structural material and at least one shell structural material, wherein the at least one of the core structural material and the at least one shell structural material of a respective layer corresponds to the respective structural material selected from the group consisting of the first structural material, second structural material, and third structural material while the other of the at least one shell structural material and at least one core structural material is a different material, and wherein the core structural material is laterally surrounded by structural material that is not core structural material on the respective layer and wherein the core structural material extends at least a portion of the axial length of the structure and has a location selected from the group consisting of: (1) the core has a length extending in an axial (i.e. longitudinal) direction of the structure in the given layer and a center of the core, as measured perpendicular to the local axis (i.e. local longitudinal direction) of the structure, along a majority of the length of the core in the given layer is offset to a given side of a center line of the structure in the given layer; (2) the core has a core length in a given layer extending in an axial (i.e. longitudinal) direction of the structure within the given layer and the core has a width in the given layer with a first edge (e.g. a left edge or a right edge) and a second edge (e.g. the other of a right edge or left edge) and wherein the first edge of the core is spaced from a first edge of the structure by a first distance, and wherein the second edge of the core is spaced from a second edge of the structure by a second distance, wherein the structure has structure width, and wherein the first distance is different from the second distance, wherein the structure width, the first distance, and the second distance are measured along at least one common measurement line that extends perpendicular to a local axial direction of the structure in a location where the at least one measurement line crosses a centerline of the structure; and (3) the core has a length extending in an axial (i.e. longitudinal) direction of the structure and has a first edge (e.g. on the left or the right) and a second edge (e.g. on the other of the right or left), wherein the structure has first edge and a second edge corresponding with the first and second edges of the core, respectively, and wherein the first edge of the core is closer to the first edge of the structure than is the second edge of the core and wherein, along at least a portion of the length of the core, the second edge of the core is closer to the first edge of the structure than to the second edge of the structure.

In a sixth aspect of the invention, a structure, includes: (a) a first planarized layer including at least a first structural material; (b) a second planarized layer including at least a second structural material, wherein the second structural material has a relationship with the first planarized layer selected from the group consisting of: (1) the second structural material is directly adhered to the first planarized layer, (2) the second structural material is separated from the first planarized layer by one or more intermediate planarized layers, and (3) the second material is separated from the first planarized layer by one or more depositions of at least one intervening material; (c) a third planarized layer including at least a third structural material, wherein the third structural material has a relationship with the second planarized layer selected from the group consisting of: (1) the third material is directly adhered to the second planarized layer, (2) the third material is separated from the second planarized layer by one or more additional intermediate planarized layers, and (3) the third material is separated from the second planarized layer by one or more depositions of at least one intervening material, wherein the second planarized layer is located between the first and third planarized layers in a layer stacking direction, wherein the second structural material is different from the first structural material and the second structural material is different from the third structural material, and wherein each of at least one of the first to third planarized layers includes at least one exposed core structural material and at least one shell structural material, wherein the at least one of the exposed core structural material and the at least one shell structural material of a respective layer corresponds to the respective structural material selected from the group consisting of the first structural material, second structural material, and third structural material while the other of the shell structural material and exposed core structural material is a different material, and wherein the exposed core structural material is completely laterally bounded along one edge, selected from the group consisting of the left and right edges, by non-core structural material and is no more than partially bounded by non-core structural material along an opposite edge such that exposed core material forms at least a portion of one layered edge of the structure and wherein the core structural material extents at least a portion of an axial length of the structure.

Other aspects of the invention will be understood by those of skill in the art upon review of the teachings herein. Other aspects of the invention may involve combinations of the above noted aspects of the invention. Other aspects of the invention may involve apparatus or methods used in creating or testing one or more of the compliant probe component aspects set forth above. These other aspects of the invention may provide various combinations of the aspects presented above as well as provide other configurations, structures, functional relationships, and processes that have not been specifically set forth above but are taught by other specific teachings set forth herein or by the teachings set forth herein as a whole. Other aspects of the invention may provide arrays of such probes such as probes bonded to substrates, probes set into one or more guide plates, or in arrays made using a combination of these techniques. Other aspects of the invention may provide shifted, extended, or offset core features as described herein to probe structures for various applications such as wafer test, burn-in, socket test, or permanent electronic contact applications or to structures that are not probes (e.g. medical devices, needles, springs, thermal contact or management devices, or other microscale or millimeter scale devices).

BRIEF DESCRIPTION OF THE DRAWINGS

FIGS. 2A-2F schematically depict side views of various stages of an electrochemical fabrication process as applied to the formation of a particular structure where a sacrificial material is selectively deposited while a structural material is blanket deposited.

FIGS. 4A-4F schematically depict the formation of a first layer of a structure using adhered mask plating where the blanket deposition of a second material overlays both the openings between deposition locations of a first material and the first material itself.

FIG. 4G depicts the completion of formation of the first layer resulting from planarizing the deposited materials to a desired level.

FIGS. 4H and 4I respectively depict the state of the process after formation of the multiple layers of the structure and after release of the structure from the sacrificial material.

DETAILED DESCRIPTION OF PREFERRED EMBODIMENTS

Electrochemical Fabrication in General

Figure 1A:
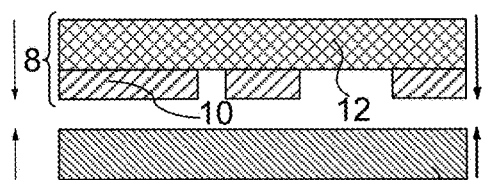
FIGS. 1A-1C schematically depict side views of various stages of a CC mask plating process, while FIGS. 1D-1G schematically depict side views of various stages of a CC mask plating process using a different type of CC mask.
Figure 1B:
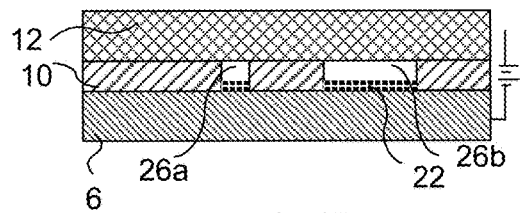
Figure 1C:
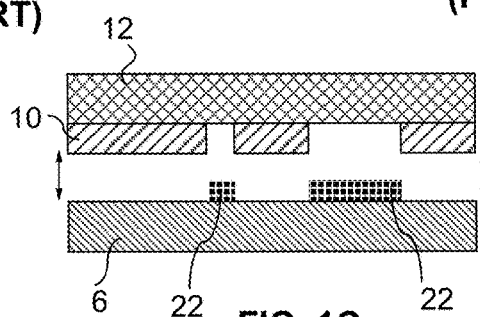
Figure 1D:
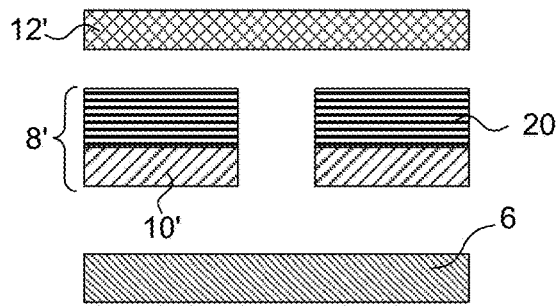
Figure 1E:
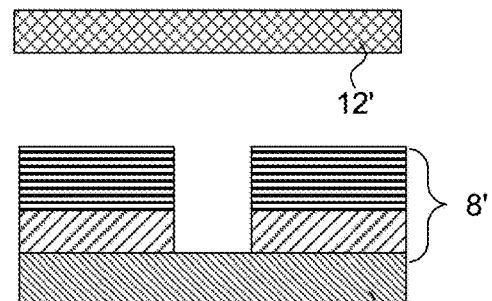
Figure 1F:
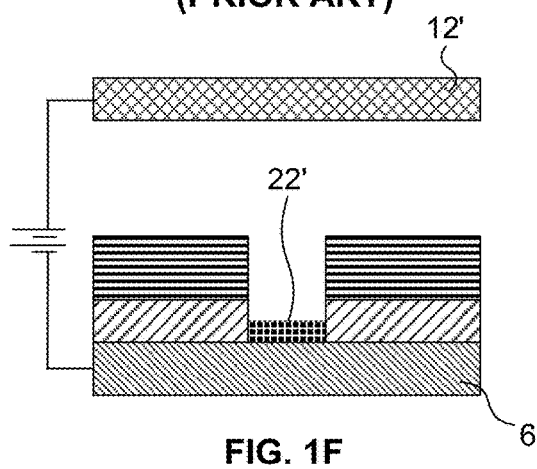
Figure 1G:
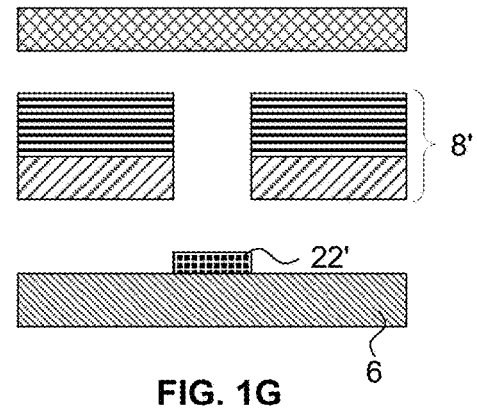
Figure 3A:
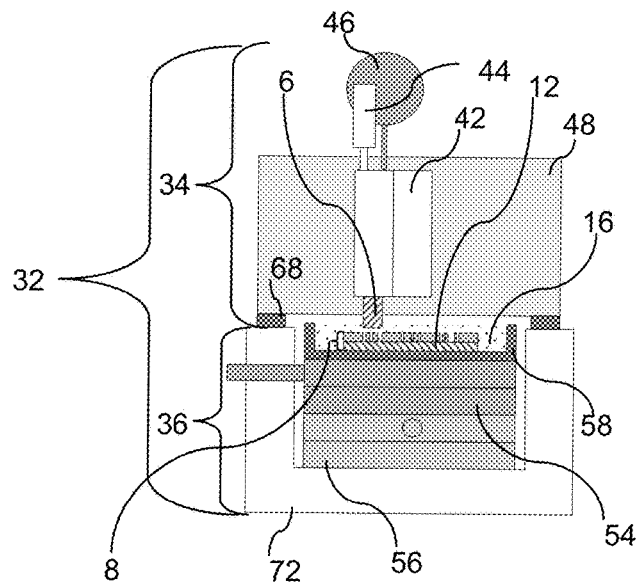
FIGS. 3A-3C schematically depict side views of various example subassemblies that may be used in manually implementing the electrochemical fabrication method depicted in FIGS. 2A-2F.
Figure 3B:
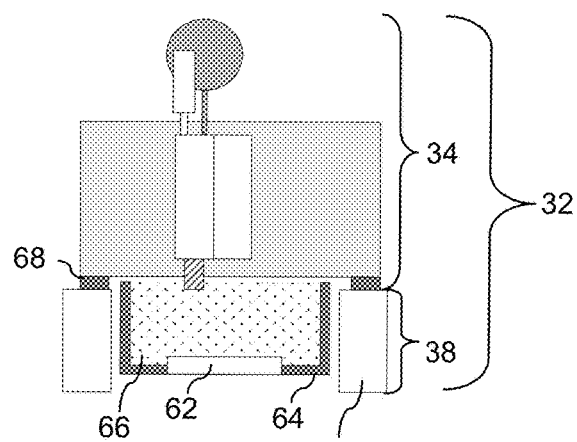
Figure 3C:
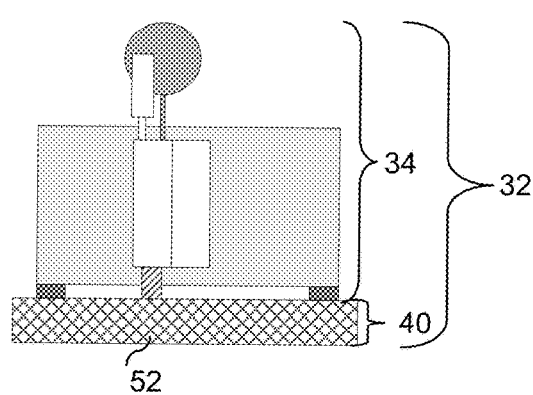

FIGS. 1A-1G, 2A—2F, and 3A—3C illustrate various features of one form of electrochemical fabrication. Other electrochemical fabrication techniques are set forth in the '630 patent referenced above, in the various previously incorporated publications, in various other patents and patent applications incorporated herein by reference. Still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

FIGS. 4A-4I illustrate side views of various states in an alternative multi-layer, multi-material electrochemical fabrication process. FIGS. 4A-4G illustrate various stages in the formation of a single layer of a multi-layer fabrication process where a second metal is deposited on a first metal as well as in openings in the first metal so that the first and second metal form part of the layer. In FIG. 4A a side view of a substrate 82 having a surface 88 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D a metal 94 (e.g. nickel) is shown as having been electroplated into the openings 92(a)-92(c). In FIG. 4E the photoresist has been removed (i.e. chemically stripped) from the substrate to expose regions of the substrate 82 which are not covered with the first metal 94. In FIG. 4F a second metal 96 (e.g. silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure is shown where each layer consists of two materials. For most applications, one of these materials is removed as shown in FIG. 4I to yield a desired 3-D structure 98 (e.g. component or device).

Various embodiments of various aspects of the invention are directed to formation of three-dimensional structures from materials some, or all, of which may be electrodeposited (as illustrated in FIGS. 1A-4I) or electroless deposited. Some of these structures may be formed from a single build level formed from one or more deposited materials while others are formed from a plurality of build layers each including at least two materials (e.g. two or more layers, more preferably five or more layers, and most preferably ten or more layers). In some embodiments, layer thicknesses may be as small as one micron or as large as fifty microns. In other embodiments, thinner layers may be used while in other embodiments, thicker layers may be used. In some embodiments, microscale structures have lateral features positioned with 0.1-10 micron level precision and minimum features size on the order of microns to tens of microns. In other embodiments structures with less precise feature placement and/or larger minimum features may be formed. In still other embodiments, higher precision and smaller minimum feature sizes may be desirable. In the present application meso-scale and millimeter-scale have the same meaning and refer to devices that may have one or more dimensions that may extend into the 0.5-50 millimeter range, or somewhat larger and features positioned with a precision in the micron to 100 micron range and with minimum feature sizes on the order of tens of microns to hundreds of microns.

The various embodiments, alternatives, and techniques disclosed herein may form multi-layer structures using a single patterning technique on all layers or using different patterning techniques on different layers. For example, various embodiments of the invention may perform selective patterning operations using conformable contact masks and masking operations (i.e. operations that use masks which are contacted to but not adhered to a substrate), proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), and/or adhered masks and masking operations (masks and operations that use masks that are adhered to a substrate onto which selective deposition or etching is to occur as opposed to only being contacted to it). Conformable contact masks, proximity masks, and non-conformable contact masks share the property that they are preformed and brought to, or in proximity to, a surface which is to be treated (i.e. the exposed portions of the surface are to be treated). These masks can generally be removed without damaging the mask or the surface that received treatment to which they were contacted or located in proximity to. Adhered masks are generally formed on the surface to be treated (i.e. the portion of that surface that is to be masked) and bonded to that surface such that they cannot be separated from that surface without being completely destroyed or damaged beyond any point of reuse. Adhered masks may be formed in a number of ways including (1) by application of a photoresist, selective exposure of the photoresist, and then development of the photoresist, (2) selective transfer of pre-patterned masking material, and/or (3) direct formation of masks from computer-controlled depositions of material.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels (i.e. regions that lie within the top and bottom boundary levels that define a different layer's geometric configuration). Such use of selective etching and interlaced material deposition in association with multiple layers is described in U.S. patent application Ser. No. 10/434,519, by Smalley, now U.S. Pat. No. 7,252,861, and entitled "Methods of and Apparatus for Electrochemically Fabricating Structures Via Interlaced Layers or Via Selective Etching and Filling of Voids" which is hereby incorporated herein by reference as if set forth in full.

Temporary substrates on which structures may be formed may be of the sacrificial-type (i.e. destroyed or damaged during separation of deposited materials to the extent they cannot be reused), non-sacrificial-type (i.e. not destroyed or excessively damaged, i.e. not damaged to the extent they may not be reused, e.g. with a sacrificial or release layer located between the substrate and the initial layers of a structure that is formed). Non-sacrificial substrates may be considered reusable, with little or no rework (e.g. replanarizing one or more selected surfaces or applying a release layer, and the like) though they may or may not be reused for a variety of reasons.

Definitions

This section of the specification is intended to set forth definitions for a number of specific terms that may be useful in describing the subject matter of the various embodiments of the invention. It is believed that the meanings of most if not all of these terms are clear from their general use in the specification but they are set forth hereinafter to remove any ambiguity that may exist. It is intended that these definitions be used in understanding the scope and limits of any claims that use these specific terms. As far as interpretation of the claims of this patent disclosure are concerned, it is intended that these definitions take presence over any contradictory definitions or allusions found in any materials which are incorporated herein by reference.

"Build" as used herein refers, as a verb, to the process of building a desired structure (or part) or plurality of structures (or parts) from a plurality of applied or deposited materials which are stacked and adhered upon application or deposition or, as a noun, to the physical structure (or part) or structures (or parts) formed from such a process. Depending on the context in which the term is used, such physical structures may include a desired structure embedded within a sacrificial material or may include only desired physical structures which may be separated from one another or may require dicing and/or slicing to cause separation.

"Build axis" or "build orientation" is the axis or orientation that is substantially perpendicular to substantially planar levels of deposited or applied materials that are used in building up a structure. The planar levels of deposited or applied materials may be or may not be completely planar but are substantially so in that the overall extent of their cross-sectional dimensions are significantly greater than the height of any individual deposit or application of material (e.g. 100, 500, 1000, 5000, or more times greater). The planar nature of the deposited or applied materials may come about from use of a process that leads to planar deposits or it may result from a planarization process (e.g. a process that includes mechanical abrasion, e.g. lapping, fly cutting, grinding, or the like) that is used to remove material regions of excess height. Unless explicitly noted otherwise, "vertical" as used herein refers to the build axis or nominal build axis (e.g. if the layers are not stacking with perfect registration) while "horizontal" or "lateral" refers to a direction that is parallel to the plane of the layers (i.e. the plane that is substantially perpendicular to the build axis). For convenience of terminology and without implying a particular physical build orientation, successive layers shall be considered to be added above previously formed layers and preceding layers will be considered to exist below later formed layers. For example, during electroplating actual build orientation may be up-facing vertical, horizontal, or at some other angle while during planarization actual build orientation may be horizontal, down-facing vertical, or at some other orientation but successive layers will still be considered to be formed on or above previously formed layers unless explicitly indicated otherwise.

"Build layer" or "layer of structure" as used herein does not refer to a deposit of a specific material but instead refers to a region of a build located between a lower boundary level and an upper boundary level which generally defines a single cross-section of a structure being formed or structures which are being formed in parallel. Depending on the details of the actual process used to form the structure, build layers are generally formed on and adhered to previously formed build layers. In some processes the boundaries between build layers are defined by planarization operations which result in successive build layers being formed on substantially planar upper surfaces of previously formed build layers. In some embodiments, the substantially planar upper surface of the preceding build layer may be textured to improve adhesion between the layers. In other build processes, openings may exist in or be formed in the upper surface of a previous but only partially formed build layer or build layers such that the openings in the previous build layer or build layers are filled with materials deposited in association with current build layer which will cause interlacing of build layers and material deposits. Such interlacing is described in U.S. patent application Ser. No. 10/434,519 now U.S. Pat. No. 7,252,861. This referenced application is incorporated herein by reference as if set forth in full. In most embodiments, a build layer includes at least one primary structural material and at least one primary sacrificial material. However, in some embodiments, two or more primary structural materials may be used without a primary sacrificial material (e.g. when one primary structural material is a dielectric and the other is a conductive material). In some embodiments, build layers are distinguishable from each other by the source of the data that is used to yield patterns of the deposits, applications, and/or etchings of material that form the respective build layers. For example, data descriptive of a structure to be formed which is derived from data extracted from different vertical levels of a data representation of the structure define different build layers of the structure. The vertical separation of successive pairs of such descriptive data may define the thickness of build layers associated with the data. As used herein, at times, "build layer" may be loosely referred simply as "layer". In many embodiments, deposition thickness of primary structural or sacrificial materials (i.e. the thickness of any particular material after it is deposited) is generally greater than the layer thickness and a net deposit thickness is set via one or more planarization processes which may include, for example, mechanical abrasion (e.g. lapping, fly cutting, polishing, and the like) and/or chemical etching (e.g. using selective or non-selective etchants). The lower boundary and upper boundary for a build layer may be set and defined in different ways. From a design point of view, they may be set based on a desired vertical resolution of the structure (which may vary with height). From a data manipulation point of view, the vertical layer boundaries may be defined as the vertical levels at which data descriptive of the structure is processed or the layer thickness may be defined as the height separating successive levels of cross-sectional data that dictate how the structure will be formed. From a fabrication point of view, depending on the exact fabrication process used, the upper and lower layer boundaries may be defined in a variety of different ways. For example, by planarization levels or effective planarization levels (e.g. lapping levels, fly cutting levels, chemical mechanical polishing levels, mechanical polishing levels, vertical positions of structural and/or sacrificial materials after relatively uniform etch back following a mechanical or chemical mechanical planarization process). For example, by levels at which process steps or operations are repeated. At levels at which, at least theoretically, lateral extents of structural material can be changed to define new cross-sectional features of a structure.

"Layer thickness" is the height along the build axis between a lower boundary of a build layer and an upper boundary of that build layer.

"Planarization" is a process that tends to remove materials, above a desired plane, in a substantially non-selective manner such that all deposited materials are brought to a substantially common height or desired level (e.g. within 20%, 10%, 5%, or even 1% of a desired layer boundary level). For example, lapping removes material in a substantially non-selective manner though some amount of recession of one material versus another material may occur (e.g. copper may recess relative to nickel). Planarization may occur primarily via mechanical means, e.g. lapping, grinding, fly cutting, milling, sanding, abrasive polishing, frictionally induced melting, other machining operations, or the like (i.e. mechanical planarization). Mechanical planarization may be followed or preceded by thermally induced planarization (e.g. melting) or chemically induced planarization (e.g. etching). Planarization may occur primarily via a chemical and/or electrical means (e.g. chemical etching, electrochemical etching, or the like). Planarization may occur via a simultaneous combination of mechanical and chemical etching (e.g. chemical mechanical polishing (CMP)).

"Structural material" as used herein refers to a material that remains part of the structure when put into use.

"Supplemental structural material" as used herein refers to a material that forms part of the structure when the structure is put to use but is not added as part of the build layers but instead is added to a plurality of layers simultaneously (e.g. via one or more coating operations that applies the material, selectively or in a blanket fashion, to one or more surfaces of a desired build structure that has been released from a sacrificial material.

"Primary structural material" as used herein is a structural material that forms part of a given build layer and which is typically deposited or applied during the formation of that build layer and which makes up more than 20% of the structural material volume of the given build layer. In some embodiments, the primary structural material may be the same on each of a plurality of build layers or it may be different on different build layers. In some embodiments, a given primary structural material may be formed from two or more materials by the alloying or diffusion of the two or more materials to form a single material. The structural material on a given layer may be a single primary structural material or may be multiple primary structural materials and may further include one or more secondary structural materials.

"Secondary structural material" as used herein is a structural material that forms part of a given build layer and is typically deposited or applied during the formation of the given build layer but is not a primary structural material as it individually accounts for only a small volume of the structural material associated with the given layer. A secondary structural material will account for less than 20% of the volume of the structural material associated with the given layer. In some preferred embodiments, each secondary structural material may account for less than 10%, 5%, or even 2% of the volume of the structural material associated with the given layer. Examples of secondary structural materials may include seed layer materials, adhesion layer materials, barrier layer materials (e.g. diffusion barrier material), and the like. These secondary structural materials are typically applied to form coatings having thicknesses less than 2 microns, 1 micron, 0.5 microns, or even 0.2 microns. The coatings may be applied in a conformal or directional manner (e.g. via CVD, PVD, electroless deposition, or the like). Such coatings may be applied in a blanket manner or in a selective manner. Such coatings may be applied in a planar manner (e.g. over previously planarized layers of material) as taught in U.S. patent application Ser. No. 10/607,931, now U.S. Pat. No. 7,239,219. In other embodiments, such coatings may be applied in a non-planar manner, for example, in openings in and over a patterned masking material that has been applied to previously planarized layers of material as taught in U.S. patent application Ser. No. 10/841,383, now U.S. Pat. No. 7,195,989. These referenced applications are incorporated herein by reference as if set forth in full herein.

"Functional structural material" as used herein is a structural material that would have been removed as a sacrificial material but for its actual or effective encapsulation by other structural materials. Effective encapsulation refers, for example, to the inability of an etchant to attack the functional structural material due to inaccessibility that results from a very small area of exposure and/or due to an elongated or tortuous exposure path. For example, large (10,000 $\mu m^2$) but thin (e.g. less than 0.5 microns) regions of sacrificial copper sandwiched between deposits of nickel may define regions of functional structural material depending on ability of a release etchant to remove the sandwiched copper.

"Stand alone structural material" or "genuine structural material" is a structural material that is resistive or not substantially removed by a sacrificial material etchant that is used in separating sacrificial and structural materials.

"Core structural material" is a structural material with no portion of the perimeter of the core structural material on a given layer being exposed to anything external to the structure, i.e. it is directly or indirectly surrounded by one or more other structural materials. In many embodiments, the core structural material is likewise completely bounded, or substantially bounded (such that an external chemical environment as little or no direct impact on the core material) by one or more structural materials located as part of the top or bottom of the given layer or located as part of one or more preceding or succeeding layers. If ambiguity exists in a given context completely isolated core structural material may be labeled "isolated core structural material" or fully enclosed or encapsulated core structural material.

"Exposed core structural material" is a core structural material that is not fully bounded on the sides by one or more other structural materials on a given layer such that it is exposed to a chemical environment that is external to the structure.

"Shell Structural material" is a term that may be used to label one or more other structural materials that surround or partially surround a core structural material on a given layer and/or bound, directly or indirectly, the core structural material from above or below.

"Sacrificial material" is material that forms part of a build layer but is not a structural material. Sacrificial material on a given build layer is separated from structural material on that build layer after formation of that build layer is completed and more generally is removed from a plurality of layers after completion of the formation of the plurality of layers during a "release" process that removes the bulk of the sacrificial material or materials. In general, sacrificial material is located on a build layer during the formation of one, two, or more subsequent build layers and is thereafter removed in a manner that does not lead to a planarized surface. Materials that are applied primarily for masking purposes, i.e. to allow subsequent selective deposition or etching of a material, e.g. photoresist that is used in forming a build layer but does not form part of the build layer) or that exist as part of a build for less than one or two complete build layer formation cycles are not considered sacrificial materials as the term is used herein but instead shall be referred as masking materials or as temporary materials. These separation processes are sometimes referred to as release processes and may or may not involve the separation of structural material from a build substrate. In many embodiments, sacrificial material within a given build layer is not removed until all build layers making up the three-dimensional structure have been formed. Of course, sacrificial material may be, and typically is, removed from above the upper level of a current build layer during planarization operations during the formation of the current build layer. Sacrificial material is typically removed via a chemical etching operation but in some embodiments may be removed via a melting operation or electrochemical etching operation. In typical structures, the removal of the sacrificial material (i.e. release of the structural material from the sacrificial material) does not result in planarized surfaces but instead results in surfaces that are dictated by the boundaries of structural materials located on each build layer. Sacrificial materials are typically distinct from structural materials by having different properties therefrom (e.g. chemical etchability, hardness, melting point, etc.) but in some cases, as noted previously, what would have been a sacrificial material may become a structural material by its actual or effective encapsulation by other structural materials. Similarly, structural materials may be used to form sacrificial structures that are separated from a desired structure during a release process via the sacrificial structures being only attached to sacrificial material or potentially by dissolution of the sacrificial structures themselves using a process that is insufficient to reach structural material that is intended to form part of a desired structure. It should be understood that in some embodiments, small amounts of structural material may be removed, after or during release of sacrificial material. Such small amounts of structural material may have been inadvertently formed due to imperfections in the fabrication process or may result from the proper application of the process but may result in features that are less than optimal (e.g. layers with stairs steps in regions where smooth sloped surfaces are desired. In such cases the volume of structural material removed is typically minuscule compared to the amount that is retained and thus such removal is ignored when labeling materials as sacrificial or structural. Sacrificial materials are typically removed by a dissolution process, or the like, that destroys the geometric configuration of the sacrificial material as it existed on the build layers. In many embodiments, the sacrificial material is a conductive material such as a metal. As will be discussed hereafter, masking materials though typically sacrificial in nature are not termed sacrificial materials herein unless they meet the required definition of sacrificial material.

"Supplemental sacrificial material" as used herein refers to a material that does not form part of the structure when the structure is put to use and is not added as part of the build layers but instead is added to a plurality of layers simultaneously (e.g. via one or more coating operations that applies the material, selectively or in a blanket fashion, to a one or more surfaces of a desired build structure that has been released from an initial sacrificial material. This supplemental sacrificial material will remain in place for a period of time and/or during the performance of certain post layer formation operations, e.g. to protect the structure that was released from a primary sacrificial material but will be removed prior to putting the structure to use.

"Primary sacrificial material" as used herein is a sacrificial material that is located on a given build layer and which is typically deposited or applied during the formation of that build layer and which makes up more than 20% of the sacrificial material volume of the given build layer. In some embodiments, the primary sacrificial material may be the same on each of a plurality of build layers or may be different on different build layers. In some embodiments, a given primary sacrificial material may be formed from two or more materials by the alloying or diffusion of the two or more materials to form a single material. The sacrificial material on a given layer may be a single primary sacrificial material or may be multiple primary sacrificial materials and may further include one or more secondary sacrificial materials.

"Secondary sacrificial material" as used herein is a sacrificial material that is located on a given build layer and is typically deposited or applied during the formation of the build layer but is not a primary sacrificial material as it individually accounts for only a small volume of the sacrificial material associated with the given layer. A secondary sacrificial material will account for less than 20% of the volume of the sacrificial material associated with the given layer. In some preferred embodiments, each secondary sacrificial material may account for less than 10%, 5%, or even 2% of the volume of the sacrificial material associated with the given layer. Examples of secondary structural materials may include seed layer materials, adhesion layer materials, barrier layer materials (e.g. diffusion barrier material), and the like. These secondary sacrificial materials are typically applied to form coatings having thicknesses less than 2 microns, 1 micron, 0.5 microns, or even 0.2 microns). The coatings may be applied in a conformal or directional manner (e.g. via CVD, PVD, electroless deposition, or the like). Such coatings may be applied in a blanket manner or in a selective manner. Such coatings may be applied in a planar manner (e.g. over previously planarized layers of material) as taught in U.S. patent application Ser. No. 10/607,931, now U.S. Pat. No. 7,239,219. In other embodiments, such coatings may be applied in a non-planar manner, for example, in openings in and over a patterned masking material that has been applied to previously planarized layers of material as taught in U.S. patent application Ser. No. 10/841,383, now U.S. Pat. No. 7,195,989. These referenced applications are incorporated herein by reference as if set forth in full herein.

"Adhesion layer", "seed layer", "barrier layer", and the like refer to coatings of material that are thin in comparison to the layer thickness and thus generally form secondary structural material portions or sacrificial material portions of some layers. Such coatings may be applied uniformly over a previously formed build layer, they may be applied over a portion of a previously formed build layer and over patterned structural or sacrificial material existing on a current (i.e. partially formed) build layer so that a non-planar seed layer results, or they may be selectively applied to only certain locations on a previously formed build layer. In the event such coatings are non-selectively applied, selected portions may be removed (1) prior to depositing either a sacrificial material or structural material as part of a current layer or (2) prior to beginning formation of the next layer or they may remain in place through the layer build up process and then etched away after formation of a plurality of build layers.

"Masking material" is a material that may be used as a tool in the process of forming a build layer but does not form part of that build layer. Masking material is typically a photopolymer or photoresist material or other material that may be readily patterned. Masking material is typically a dielectric. Masking material, though typically sacrificial in nature, is not a sacrificial material as the term is used herein. Masking material is typically applied to a surface during the formation of a build layer for the purpose of allowing selective deposition, etching, or other treatment and is removed either during the process of forming that build layer or immediately after the formation of that build layer.

"Multi-layer structures" are structures formed from multiple build layers of deposited or applied materials.

"Multi-layer three-dimensional (or 3D or 3-D) structures" are multi-layer structures that are formed from at least two layers where the structural material portion of at least two of the at least two layers at least partially overlap and are bonded together but where at least one of the layers has a portion that does not completely overlap structural material portions of the other. In other words, a Boolean intersection of the area covered by the two layers is non-zero and a Boolean subtraction of the area covered by at least one of the layers relative to the other layer is non-zero (i.e. an upper layer has a down-facing portion relative to the lower layer or the lower layer has an up-facing portion relative to the upper layer.

"Complex multi-layer three-dimensional (or 3D or 3-D) structures" are multi-layer three-dimensional structures formed from at least three layers where, when considering a single structure, a line may be defined that hypothetically extends vertically through at least some portion of the build layers of the structure and extends from structural material through sacrificial material and back through structural material or will extend from sacrificial material through structural material and back through sacrificial material (these might be termed vertically complex multi-layer three-dimensional structures). Alternatively, complex multi-layer three-dimensional structures may be defined as multi-layer three-dimensional structures formed from at least two layers where, when considering a single structure, a line may be defined that hypothetically extends horizontally through at least some portion of a build layer of the structure that will extend from structural material through sacrificial material and back through structural material (these might be termed horizontally complex multi-layer three-dimensional structures). Worded another way, in complex multi-layer three-dimensional structures, a vertically or horizontally extending hypothetical line will extend from one of structural material to void (when the sacrificial material is removed) and then back to structural material as the line is traversed along at least a portion of the line.

"Moderately complex multi-layer three-dimensional (or 3D or 3-D) structures are complex multi-layer 3D structures for which, when considering a single structure, the alternating of structure-void-structure not only exists along one of a vertically or horizontally extending line but along lines extending both vertically and horizontally.

"Highly complex multi-layer (or 3D or 3-D) structures are complex multi-layer 3D structures for which, when considering a single structure, the structure-to-void-to-structure or void-to-structure-to-void alternating occurs not only once but occurs a plurality of times along a definable horizontally and/or vertically extending line.

"Up-facing feature" is an element dictated by the cross-sectional data for a given build layer "n" and a next build layer "n+1" that is to be formed from a given material that exists on the build layer "n" but does not exist on the immediately succeeding build layer "n+1". For convenience the term "up-facing feature" will apply to such features regardless of the build orientation.

"Down-facing feature" is an element dictated by the cross-sectional data for a given build layer "n" and a preceding build layer "n−1" that is to be formed from a given material that exists on build layer "n" but does not exist on the immediately preceding build layer "n−1". As with up-facing features, the term "down-facing feature" shall apply to such features regardless of the actual build orientation.

"Continuing region" is the portion of a given build layer "n" that is dictated by the cross-sectional data for the given build layer "n", a next build layer "n+1" and a preceding build layer "n−1" that is neither up-facing nor down-facing for the build layer "n".

"Minimum feature size" or "MFS" refers to a necessary or desirable spacing between structural material elements on a given layer that are to remain distinct in the final device configuration. If the minimum feature size is not maintained for structural material elements on a given layer, the fabrication process may result in structural material inadvertently bridging what were intended to be two distinct elements (e.g. due to masking material failure or failure to appropriately fill voids with sacrificial material during formation of the given layer such that during formation of a subsequent layer structural material inadvertently fills the void). More care during fabrication can lead to a reduction in minimum feature size. Alternatively, a willingness to accept greater losses in productivity (i.e. lower yields) can result in a decrease in the minimum feature size. However, during fabrication for a given set of process parameters, inspection diligence, and yield (successful level of production) a minimum design feature size is set in one way or another. The above described minimum feature size may more appropriately be termed minimum feature size of gaps or voids (e.g. the MFS for sacrificial material regions when sacrificial material is deposited first). Conversely a minimum feature size for structure material regions (minimum width or length of structural material elements) may be specified. Depending on the fabrication method and order of deposition of structural material and sacrificial material, the two types of minimum feature sizes may be the same or different. In practice, for example, using electrochemical fabrication methods as described herein, the minimum features size on a given layer may be roughly set to a value that approximates the layer thickness used to form the layer and it may be considered the same for both structural and sacrificial material widths. In some more rigorously implemented processes (e.g. with higher examination regiments and tolerance for rework), it may be set to an amount that is 80%, 50%, or even 30% of the layer thickness. Other values or methods of setting minimum feature sizes may be used. Worded another way, depending on the geometry of a structure, or plurality of structures, being formed, the structure, or structures, may include elements (e.g. solid regions) which have dimensions smaller than a first minimum feature size and/or have spacings, voids, openings, or gaps (e.g. hollow or empty regions) located between elements, where the spacings are smaller than a second minimum feature size where the first and second minimum feature sizes may be the same or different and where the minimum feature sizes represent lower limits at which formation of elements and/or spacing can be reliably formed. Reliable formation refers to the ability to accurately form or produce a given geometry of an element, or of the spacing between elements, using a given formation process, with a minimum acceptable yield. The minimum acceptable yield may depend on a number of factors including: (1) number of features present per layer, (2) numbers of layers, (3) the criticality of the successful formation of each feature, (4) the number and severity of other factors effecting overall yield, and (5) the desired or required overall yield for the structures or devices themselves. In some circumstances, the minimum size may be determined by a yield requirement per feature which is as low as 70%, 60%, or even 50%. While in other circumstances the yield requirement per feature may be as high as 90%, 95%, 99%, or even higher. In some circumstances (e.g. in producing a filter element) the failure to produce a certain number of desired features (e.g. 20-40% failure may be acceptable while in an electrostatic actuator, the failure to produce a single small space between two moveable electrodes may result in failure of the entire device. The MFS, for example, may be defined as the minimum width of a narrow sacrificial element (e.g. photoresist element or sacrificial material element) or structural element (e.g. structural material element) that may be reliably formed (e.g. 90-99.9 times out of 100) which is either independent of any wider structures or has a substantial independent length (e.g. 200-1000 microns) before connecting to a wider region.

"Sub-layer" as used herein refers to a portion of a build layer that typically includes the full lateral extents of that build layer but only a portion of its height. A sub-layer is usually a vertical portion of build layer that undergoes independent processing compared to another sub-layer of that build layer. As used herein, use of a sub-layer in the formation of a layer requires use of at least a second sub-layer in formation of that layer and as such, the sub-layers shall be numbered (e.g. first, second, etc., depending on their order of formation) and the layer of which they form a part may be referred to a as a "compound layer" to avoid confusion with normal layer build up processes as set forth herein.

Cores and Offset Cores

Figure 5A:
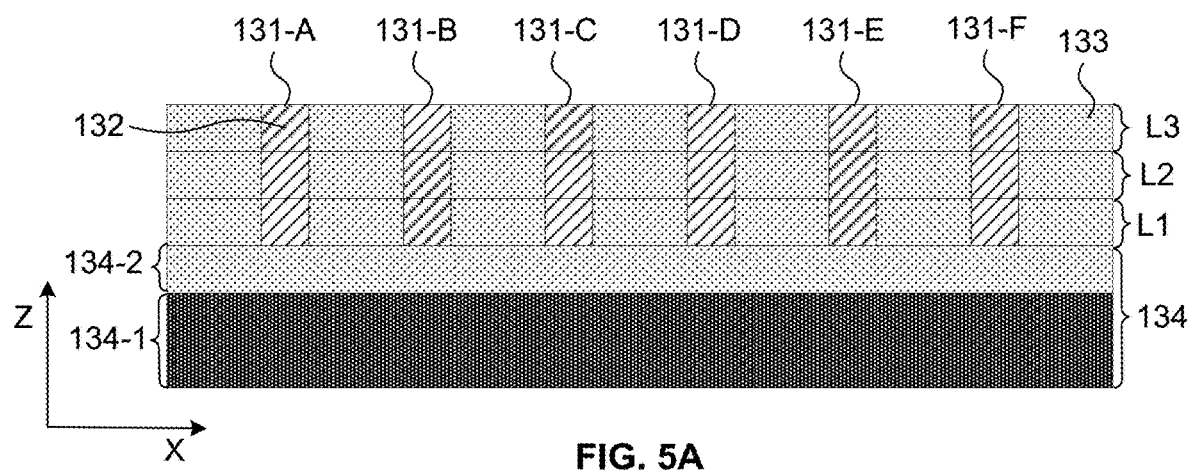
FIGS. 5A and 5B provide a side cut view (FIG. 5A) of a plurality of three-layer parts and a top view (FIG. 5B) of the last layer of those parts respectively, wherein the parts are a plurality of example probes being formed in a batch, multi-layer, multi-material fabrication process.
Figure 5B:
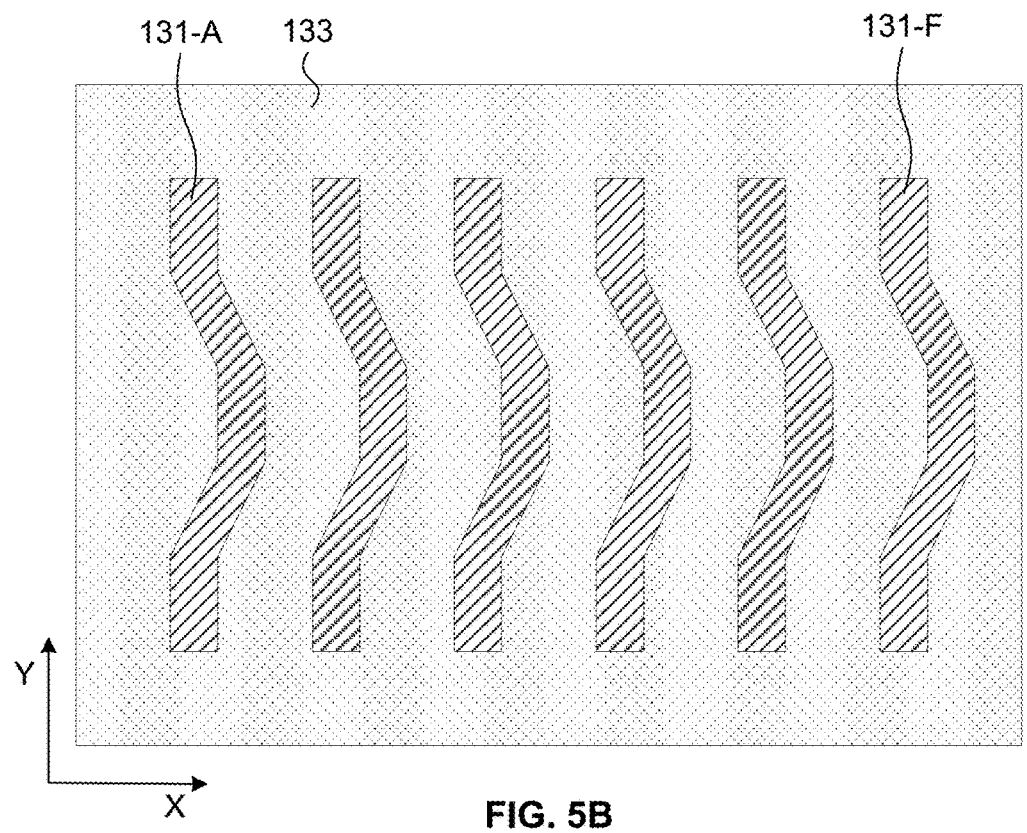

FIGS. 5A-5D help illustrate how the fabrication processes noted above and elsewhere herein can be applied in a batch manner to the formation of a plurality of multi-layer probe structures. FIG. 5A provides a side cut view of a plurality of example parts 131-A to 131-F formed from a structural material 132 on three layers L1, L2 and L3. In addition to the structural material each of the three layers L1-L3 were also formed with a sacrificial material 133. Layer 1 (L1) of the parts is formed on a release layer 134-2 that was formed on a substrate material 134-1 wherein together 134-1 and 134-2 may be considered a complete substrate 134. FIG. 5B provides a top view of the formed parts 136-A to 136-F wherein lateral regions (or X and Y regions) of individual parts can be seen. The substrate 134 (i.e. 134-1) may be considered to be reusable for building other parts after reformation of a release layer 134-2 that may be removed or become damaged during the fabrication of a previous set of parts or during the release of those parts from the substrate.

Figure 5C:
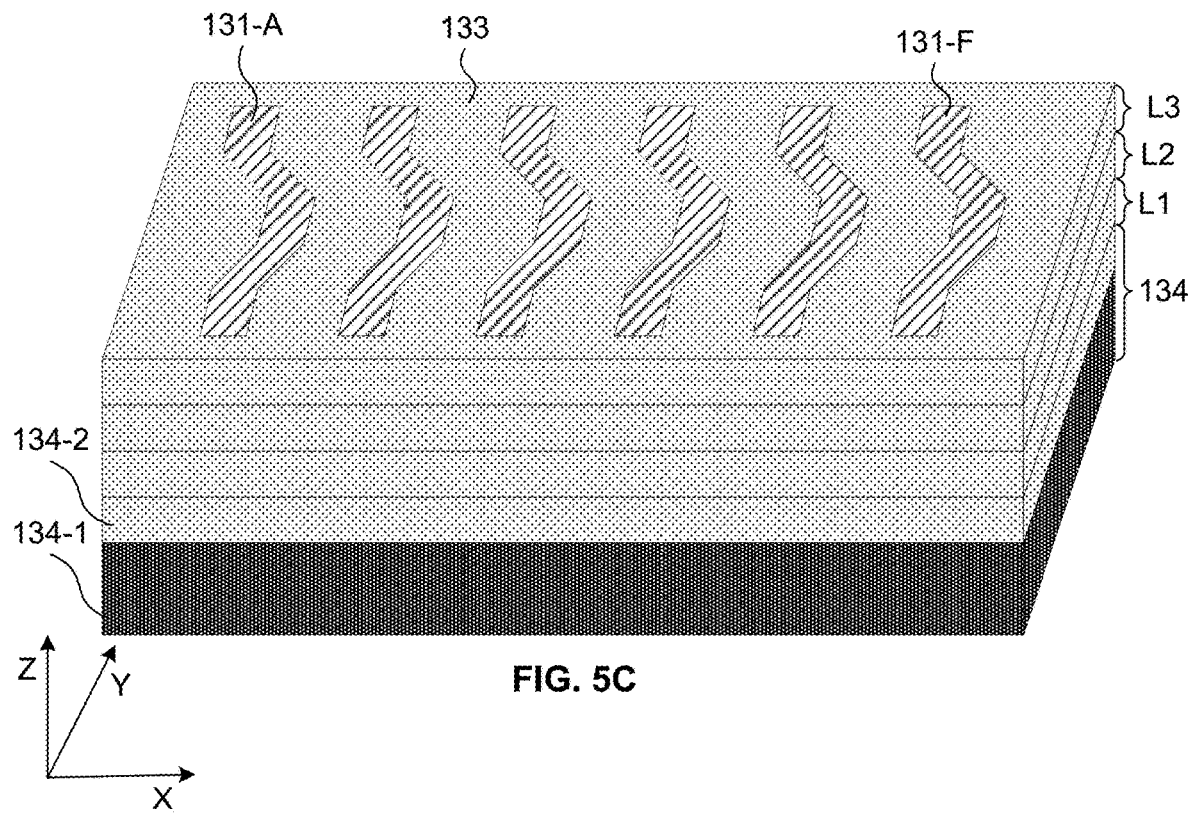
FIGS. 5C and 5D provide perspective views of the batch fabricated probe parts of FIGS. 5A and 5B wherein the parts are shown prior to release (FIG. 5C) and after release (FIG. 5D).
Figure 5D:
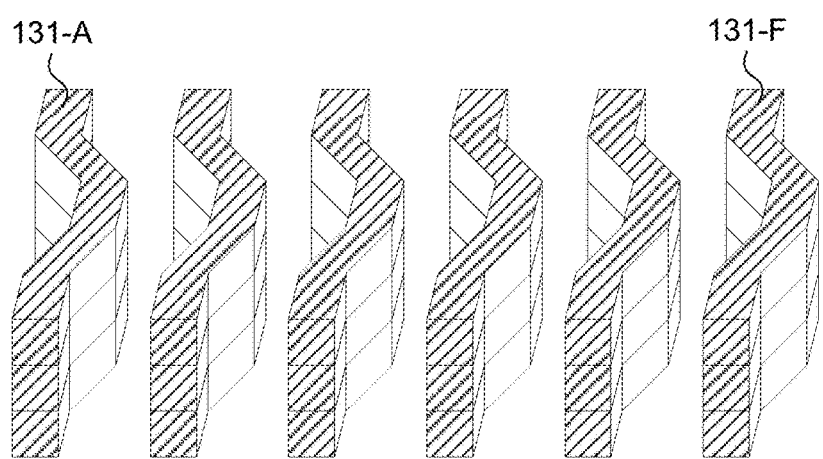

FIGS. 5C and 5D provide perspective views of the batch fabricated parts of FIGS. 5A and 5B. In FIG. 5C the parts are shown in the same process state as that of FIGS. 7A and 7B (i.e. prior to release of the parts from the sacrificial material 133 and from the substrate 134-1). FIG. 5D shows the six three-layer parts 131-A to 131-F after release.

Figure 6A:
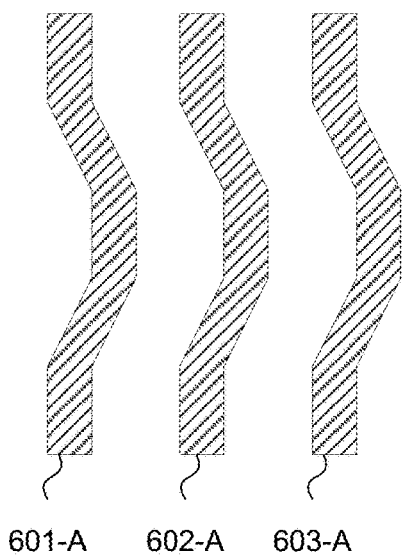
FIGS. 6A-6E illustrate top views of $1^{st}$ to $3^{rd}$ layers for five different example three-layer probe configurations.
Figure 6B:
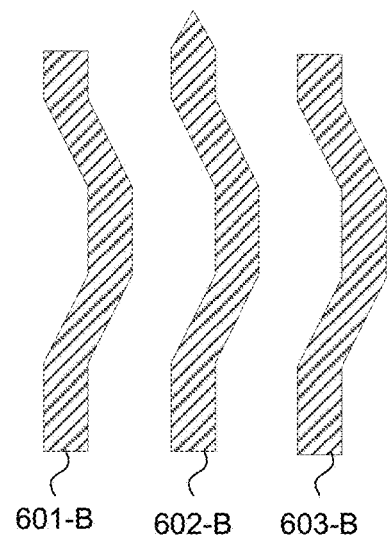
Figure 6C:
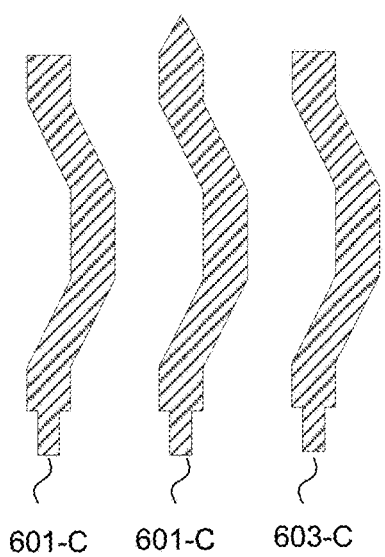
Figure 6D:
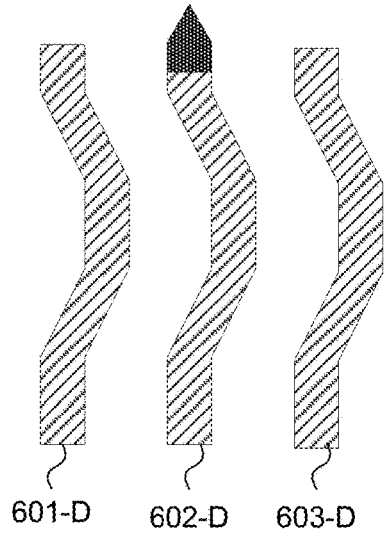
Figure 6E:
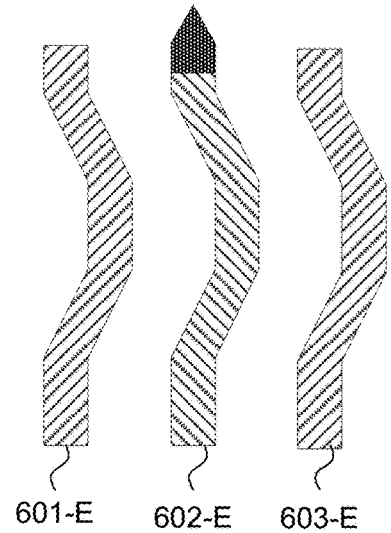

FIGS. 6A-6E illustrate first to third layers for five different three-layer probe configurations where FIG. 6A illustrates the first 601-A, second 602-A, and third 603-A layers formed without a special tip configuration. FIG. 6B illustrates the first 601-B, second 602-B, and third 603-B layers with only the second layer 602-B formed with a special pointed tip configuration. FIG. 6C illustrates first 601-C, second 602-C, and third 603-C layers with only the second layer 602-B formed with a special tip configuration but with all three layers formed with notched tail ends or proximal end configurations that may aid with mounting or bonding to a base. FIG. 6D illustrates first 601-D, second 602-D, and third 603-D layers with the second layer 602-D having not only a special tip configuration but also with the tip being formed of a distinct tip contact material. FIG. 6E illustrates first 601-E, second 602-E, and third 603-E layers with the second layer 602-E having a special tip configuration and a distinct tip material but also with different materials forming the majority of the compliant portions on the tip layer compared to the material being used in forming the $1^{st}$ and $3^{rd}$ layers.

Alternatives include contact tips at each end; use of probes in guide plates (e.g. single guide plates, pairs of guide plates, or even more than two guide plates); probes formed from multiple beams separated by air gaps; probes formed from multiple beams separated by dielectric materials; probes surrounded at least in part by dielectric material (e.g. where extending through conductive guide plate regions when electrical isolation is desired); straight probes; probes that are straight as formed but which are loaded into guide plates so as to achieve a predetermined flexed configuration (e.g. to ensure selected bending upon contact/usage); tips formed on more than one layer; multiple tips formed on a single end of a single layer; and probes formed with multiple independent and electrically isolated paths with separate contact tips or with separate contact regions (e.g. tips for signal paths and grounding regions to connect shields to guide plates or other conductive elements).

Figure 7A:
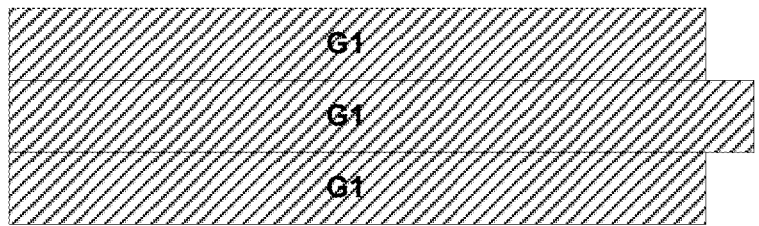
FIGS. 7A-7D illustrate side-cut views and end-cut views of four different similarly shaped example three-layer probe configurations with different materials forming some portions of some probes.
Figure 7A:
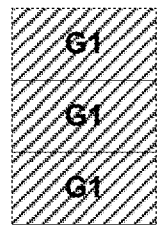
Figure 7B:
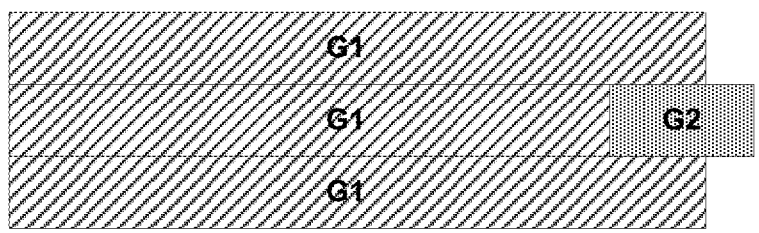
Figure 7B:
Figure 7C:
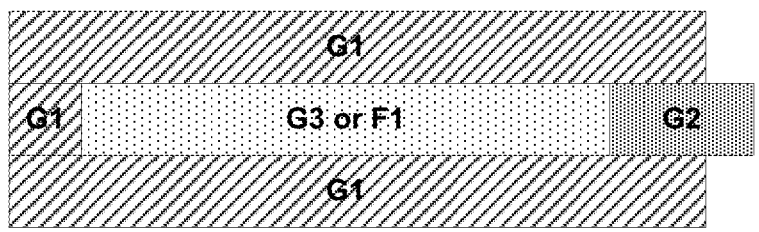
Figure 7C:
Figure 7D:
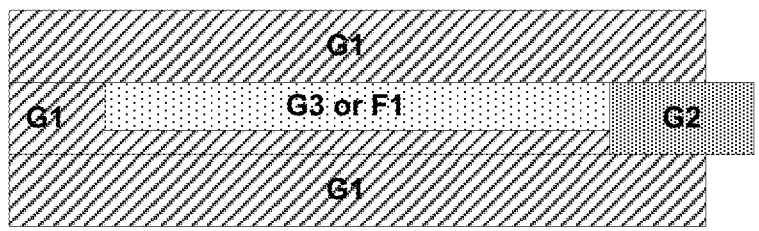
Figure 7D:
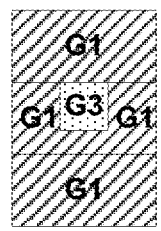

FIGS. 7A-7D illustrate side cut views and end cut views of four different similarly shaped three-layer probe configurations with different materials forming certain features of some of the probes. FIG. 7A illustrates a side cut vie and end cut view showing a probe with a single layer forming an extended tip but with all portions of all layers formed of the same material G1. FIG. 7B shows a probe having a distinct tip material G2 on one end. FIG. 7C shows a probe having a distinct tip material G2 on one end but also having a distinct core material formed of a genuine structural material G3 or of a functional structural material F1 (e.g. copper) occupying at least part of a compliant intermediate portion of the length of the probe wherein the core material occupies the entire thickness of the second layer. FIG. 7D depicts a probe having a distinct tip material G2 and an intermediate core G3 or F1 formed within a shell material G1 using a core and shell technique that causes the shell material to occupy the base of the second layer as well as forming side walls around its core as will be discussed here after.

Figure 8A:
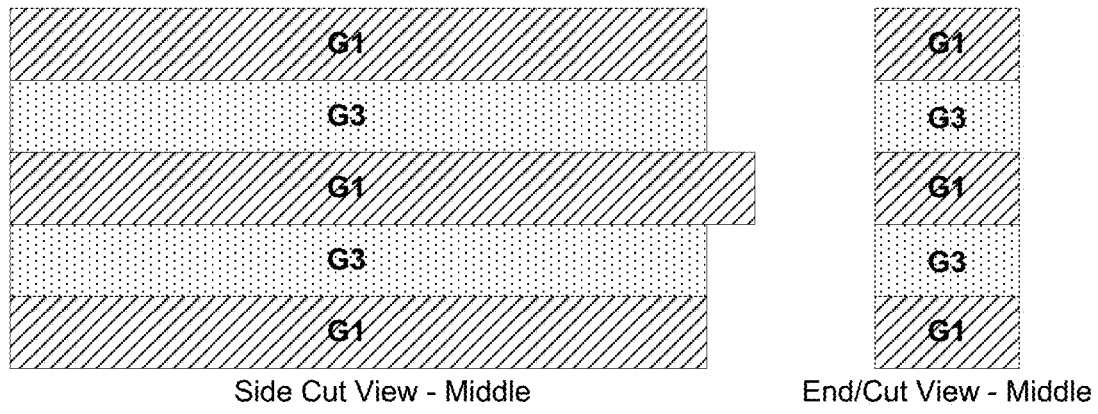
FIGS. 8A and 8B illustrate side-cut views and end-cut views of two different similarly shaped five-layer probe configurations with different materials forming some of portions of each probe.
Figure 8B:
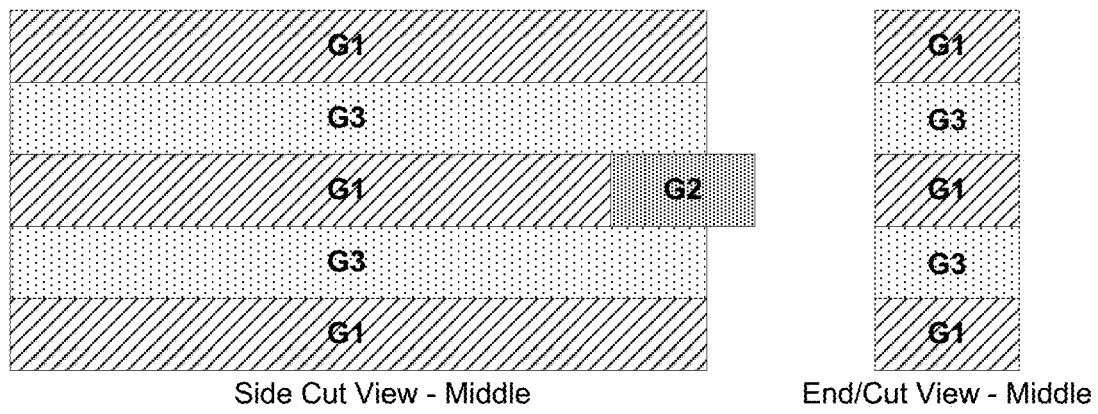
Figure 9A:
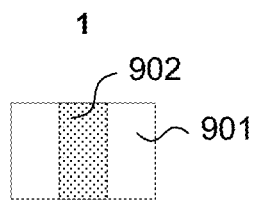
FIGS. 9A-9D provide illustrations of example core shell configurations that can be formed on a single layer using different formation methods.
Figure 9B:
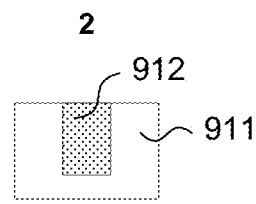
Figure 9C:
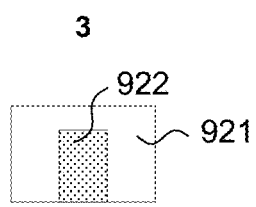
Figure 9D:
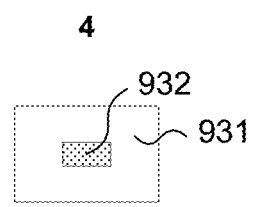

FIGS. 8A and 8B provide side cut views and end cut views of two different but similarly shaped five-layer probe configurations where different materials are used in forming some portions of each probe. FIG. 8A depicts the five layer probe body as being formed from two different materials with the first, third, and fifth layers being formed from one genuine structural material G1 and the second and fourth layers being formed from a different genuine structural material G3. FIG. 8B is similar to FIG. 8A with the exception of the right most tip end of the third layers replacing material G1 with a distinct tip material G2. Examples of genuine structural material #1 and #3 include Ni, NiCo, Pd, PdCo, Au, and Ag while examples of genuine structural material #2 include NiCo, Pd, and Rh for tip region.

FIGS. 9A-9D provide illustrations of example core shell configurations that can be formed on a single layer using different formation methods. Such methods for making cores and shells may be used in forming selected portions of structures, forming portions of selected portions of layers, or even in forming multiple shells and cores on selected layers, or cores and shells that extend into or through more than one layer. In some embodiments shells and cores may be used when spring or compliant regions of probes, portions of compliant regions, and even tip regions of probes. In some embodiments dielectric material may also be used to form dielectric shells around conductive probe regions, to form insulative regions between multiple independent conductive paths, and between inner and outer conductive coaxial portions of probes.

In a first approach (shown in FIG. 9A), masked based patterning may be used to form the core 902 and shell 901 such that the core extends from the bottom of a layer to the top of a layer. In this first approach the layer may be formed with one or two patterning operations depending on whether core material and the sacrificial material (SACMAT) are the same. The patterned deposition operations may be followed by one additional deposition which may be of the patterned or blanket type and which in turn is followed by one or more planarization operations to remove any overlying material and to set the height of the layer. Of course, depending on other layer features and materials that are being deposited additional operations may be utilized in forming the layer.

In a second approach (shown in FIG. 9B), masked based thin shell deposition may be used to form the core 912 and shell 911 such that the shell of a given layer surrounds the sides and bottom of the core but does not provide for the capping of the top of the core. In this second approach the shell may be formed within an opening in a surrounding conductive material (e.g. a SACMAT) wherein a deposition of shell material is made to a thickness that is less than the layer thickness. Since the shell material is deposited into a conductive pocket, the shell material forms an up-facing pocket with a bottom surface and side walls. After formation of the shell material, the core material may be deposited to fill the pocket to a desired depth (e.g. to a height that extends beyond the upper surface of the layer that is being formed). After completion of any other required deposition operations, planarization may be used to set the boundary level for the layer and to remove any overlying extraneous material.

In a third approach (shown in FIG. 9C), masked based thin core deposition followed by shell deposition may be used to form the core 921 and shell 922 such that the shell of a given layer surrounds the sides and the top of the core but does not underlie the core. In this third approach the core may be patterned first by depositing the core within an opening in a mold (e.g. a photoresist mold) to a height less than that of the intended layer thickness. After formation of the core, the removal of any mold, and the formation of any needed additional mold, the shell material may be deposited to a depth that ensures the shell extends above the intended height of the layer. After any additional depositions or related formation operations, planarization may occur to the set the height of the layer leaving a shell that caps and surrounds the sides of a core.

In a fourth approach, sublayer formation may be used to form a core 932 that overlays a shell 931 as well as is capped by and surrounded by the shell. In such an approach, the single layer may be formed as two sublayers via the lower portion of the layer, i.e. first sublayer, being formed by the second approach which would end with a mid-level planarization and which in turn would be followed by formation of a cap which may or may not be part of a fully planarized second sublayer. Alternatively, a patterned deposition of the lower portion of the shell may be created by a deposition which has a height less than that of the layer thickness (e.g. to form a first sublayer portion), which may or may not be followed by planarization, and which is followed by the third approach to create the second sublayer portion.

The first through third approaches set forth above may be combined on successive layers to form cores and shells that extend completely, or in part, through multiple layers. For example, a core starting in the middle of an (N)th layer could extend through an (N+1)th layer and end in the middle of an (N+2)th layer by using the second method in forming the (N)th layer, the first method in forming the (N+1)th layer, and using the third method in forming the (N+2)th layer. Similarly a core extending from the bottom of an (N)th layer to the top of an (N+1)th layer could be made by using a standard process to form an (N−1)th layer and a (N+2)th layer while using the first method to form the (N)th and the (N+1) the layer. Other combinations are possible and will be understood by those of skill in the art after review of the teachings herein.

Figure 10A:
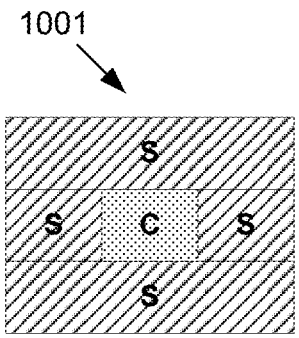
FIG. 10A illustrates a cross-section of a three-layer part along a local longitudinal length of the probe that has a centered or unshifted core on a center layer.
Figure 10B:
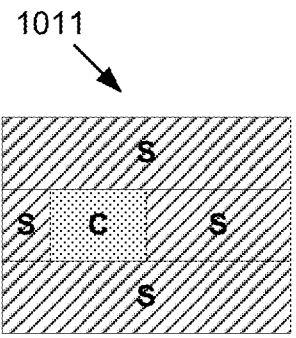
FIGS. 10B-10D illustrate three example shifted cores as seen in cut end views of the parts.
Figure 10C:
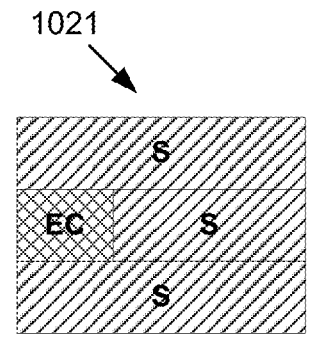
Figure 10D:
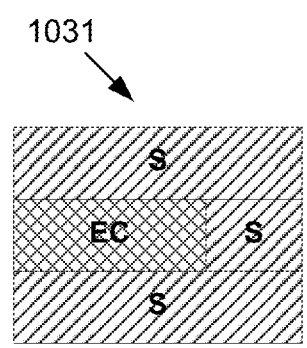

FIG. 10A illustrates a cut-cross-section of a three-layer part (e.g. probe) along a local longitudinal length of the probe that has a centered or unshifted core on a center layer (i.e. a core that is substantially centered relative to a cross-section of the probe that is substantially perpendicular to a local longitudinal dimension of the probe or is substantially symmetric relative to the center line of the probe within the layer or layers in which it is located or has equal spacing from the side walls of the probe along the length of the core within the layer or layers in which it is located). FIGS. 10B-10D illustrate cut-cross-sectional views of three different three-layer parts (e.g. probes) having shifted cores. In the examples of FIGS. 10A-10D, the shell material S on the second layer is the same as the structural material S of the first and third layers and wherein C represents a core material while EC represents an exposed core material. Since S and EC are directly in contact with sacrificial material, if an etchant will be used to removed the sacrificial material, than S and EC must be formed of genuine structural material (i.e. a structural material that is not substantially attacked by an etchant that removes sacrificial material from the part) while C may be formed of either a genuine or functional structural material because it will not come into contact with any sacrificial material etchant.

In the example of part 1011 (FIG. 10B), the core is not unshifted or centered but instead is shifted such that at least one of the following conditions occurs for either a single layer of a core or for all layers of a core and for either a single core on a layer or for a combination of multiple cores on a single layer: (1) the center of mass of the core has shifted away from the center line of the probe, (2) the core no longer has a portion located along the center line of the probe and the core has not fully reached a side surface of the probe, or (3) the lateral extents of the core are not symmetric about the centerline of the probe.

In the example of part 1021 (FIG. 10O), the core is not unshifted or centered but instead is shifted such that the core has been shifted to a position that reaches a side wall of the probe exclusive of any dielectric coating material may be located on the external surface of the probe or conformable applied coating of conductive material that may overlay the edges of the layers of the probe. In the example of part 1021 the core may or may not be located along the center line of the probe.

In the example of part 1031 (FIG. 10D), a wide core (i.e. a core with a cross-section width greater than one-half the probe width) may be considered to be shifted to the left such that one side of the core reaches a side wall or alternative narrow centered cored may be considered to be extended on one side such that the core reaches one side of the probe. In some alternatives (not shown) a wide core or an extended core need not be shifted or extended so far as to reach a side wall of the probe. The shifting or extension of the core to one side may be exclusive of any dielectric coating that overlayers the sides of the layer or any conformal conductive coating that overlays the sides of the layers of the probe.

As will be understood by those of skill in the art, in some embodiments with shifted or extended cores, an entire longitudinal length of a core may be shifted or extended or only a portion of the entire length may be shifted or extended. In some embodiments, it is preferred that 100% of the length of the probe be shifted or extended while in other embodiments, the shift or extension may be over only a continuous or segmented portion of the core length, e.g. greater than or less than 90%, 70%, 50%, 30%, or even 10% of the length of the core. On a given layer single cores may exist or multiple cores may exist, cores may extend to or additional isolated cores may exist on different layers. In some embodiments, all cores may be extended or shifted in the same or different directions while in other embodiments, only a portion of the cores may be extended or shifted in the same or different directions. In still other embodiments, only selected portions of selected layers of multi-layer cores may undergo shifting or extension.

In some embodiments, shifting of cores may occur for different reasons design reasons ranging from mechanical to electrical to thermal, or even ascetic reasons where improvements may be provided for example by material strength variations that shifting or extending provides, thermal expansion or contraction variations (e.g. bimetallic properties), elastic or compliant property variations, electrical conductivity, capacitance, or inductance variations associated with DC, low frequency or even RF frequency currents and voltages.

Figure 11B:
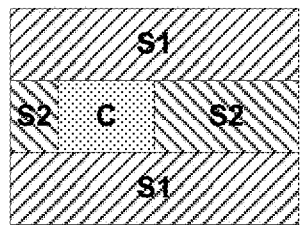
FIGS. 11B-11D illustrate three different parts having shifted or extended cores wherein the shell material S2 on the second layer is different from the structural material 51 on the first and third layers.
Figure 11A:
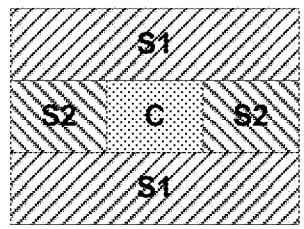
FIG. 11A illustrates a three layer part with an unshifted single layer core wherein the shell material S2 on the second layer is different from the structural material 51 on the first and third layers.

FIG. 11A illustrates a cut-cross-sectional view of a part (e.g. probe) with unshifted single layer core wherein the shell material S2 on the second layer is different from the structural material S1 on the first and third layers.

Figure 11C:
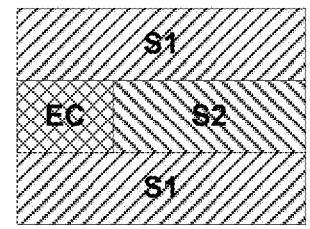
Figure 11D:
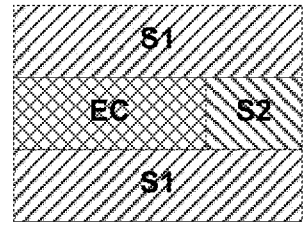

FIG. 11B-11D illustrate cut-cross-sectional views of three parts (e.g. probes) with shifted or extended cores wherein the shell material S2 on the second layer is different from the structural material S1 on the first and third layers. The illustration of FIGS. 11B-11D are similar to those of FIGS. 10B-10D respectively with the exception of the non-core structural materials on the first and third layers being different from the shell material on the second layer.

Numerous variations to the examples shown in FIGS. 10 and 11 are possible and include:

(1) The part (e.g. probe) being formed from a greater or lesser number of layers.
(2) The cross-sectional width of at least some layers may be different at at least some locations along the length of the probe.
(3) The thickness of at least some layers being different as compared to the thickness of other layers.
(4) The part (e.g. probe) including one or more coatings that are deposited or formed, or treatments that are applied, on at least selected portions of the outer surfaces of the layers (i.e. in a post-layer formation deposition process) wherein the coating material(s) may, for example, provide (a) a conductive surface, (b) a dielectric surface, (c) a conductive surface in some locations and dielectric surface in others, a conductive surface over a dielectric surface, or a dielectric surface over a conductive surface, (d) aid in bonding, (e) a bonding material, (f) enhanced slippage between a probe surface and a surface that the probe contacts (e.g. one or more guide plates), (g) a surface with low contact resistance, (h) a more wear resistant surface, (i) a surface that promotes reduced arcing, and/or (j) a tip surface that aids in oxide removal as the probe contacts a pad of an electronic device.
(5) The core being formed as part of multiple layers.
(6) Multiple separated or periodically connected cores existing on a single layer and/or on multiple layers.
(6) The offset, shifting, or extension of core elements being different on different layers (e.g. different in magnitude at a given longitudinal location or different in direction of offset, shifting or extension at a given longitudinal location).
(7) Multi-layer cores having enhanced surface area to volume ratios compared to that of a rectangular structure.
(8) Cores and shell material on a given layer being separated by an air gap or other dielectric material gaps.
(9) Cores being made of a conductive material or of a dielectric material.
(10) On some layers, cores being shifted to one direction (e.g. to the left or the right while looking along the probe axis (i.e. longitudinal direction from base end to contact tip end or vice-a-versa), with layer stacking occurring from bottom to top or top to bottom along an axis perpendicular to the length of the probe and generally perpendicular to the axis of the probe).
(11) Core shifting being quantified in a number of different ways:
 (a) In terms of a distance a core center line is displaced from a probe center line at a given cross-sectional location,
 (b) In terms of an Offset Parameter, 0=LD−RD, where LD is left edge distance from center and RD is the right edge distance from center with both measured as positive numbers.)
 (c) In terms of an Offset Ratio=(LD−RD)/(1/2*Probe width)
 (d) In terms of a Left Edge Offset Position (LEOP) minus the Left Edge Position without an Offset (LENOP) or Right Edge Offset (REOP) minus the Right Edge Position without an Offset (RENOP), Left Offset=LEOP−LENOP, or Right Offset=REOP−RENOP (e) In terms of a distance difference (substantially perpendicular a layer stacking direction and to a local longitudinal axis of the probe) between a cross-sectional center of mass of the core and a cross-sectional center of mass of either the non-core material or both the core-material and the non-core material.
 (f) when multiple cores exist, the offset of the core material may be determined by (1) providing a weighted sum of the offsets for each core as determined by any of (a)-(e) where the weighting function is based on mass, or (2) by applying the center of mass method of (e) to all cores. Alternatively, the offset may be determined based on a single one of the cores or a subset of the plurality of cores.
(12) Single layer shell and cores being formed by, for example: (1) mask based patterning, (2) masked based thin shell deposition, (3) mask based thin core deposition followed by shell deposition, (4) sublayer formation as set forth in FIGS. 9A-9D or in one of the incorporated patents or patent applications.
(13) Multi-layer cores being formed by a combination of methods (1)-(4) of alternative (12) where methods may include, for example:
 (a) Applying Method (1) on all layers
 (b) Applying Method (2) on a first layer, followed by Method (1) or (3) on the intermediate layer or layers (with the planarization of (3) removing any capping shell material), and concluding with Methods (1), (3), or (4) on the final cored layer.
(14) Probes having contact tips formed from a material that is different from a material used to give the body of the probe resilience and/or enhanced current carrying capacity.
(15) Probes being formed with the core material running from distal end to tip end or the core ending short of the distal end and/or short of the tip end.

(16) The amount of offset being constant or varying from one position to another along a length of the probe as may the width of the core or even the width of the probe itself.

(17) In some implementations, the offset of a core from a centered position being fixed or changing sides (e.g. from left to right or right to left) along the length of the probe depending on the effect desired and the shape of the probe. For example if the probe has a back and forth snake-like configuration across a center line of the probe, it may be beneficial to shift the core to different sides of the probe depending on whether the probe has a left or right curvature at any given position along the length of the probe.

FURTHER COMMENTS AND CONCLUSIONS

Various other embodiments of the present invention exist. Some of these embodiments may be based on a combination of the teachings herein with various teachings incorporated herein by reference. For example, some embodiments may not use any blanket deposition process. Some embodiments may use selective deposition processes or blanket deposition processes on some layers that are not electrodeposition processes. Some embodiments may use nickel as a structural material while other embodiments may use different materials. For example, preferred spring materials include nickel (Ni), copper (Cu), beryllium copper (BeCu), nickel phosphorous (Ni—P), tungsten (W), aluminum copper (Al—Cu), steel, P7 alloy, palladium, molybdenum, manganese, brass, chrome, chromium copper (Cr—Cu), and combinations of these. Some embodiments may use copper as the structural material with or without a sacrificial material.

Some embodiments may apply the fabrication processes disclosed herein to the production of microprobes while other embodiments may apply these methods in the fabrication of other devices for other applications.

Structural or sacrificial dielectric materials may be incorporated into embodiments of the present invention in a variety of different ways. Such materials may form a third material or higher deposited on selected layers or may form one of the first two materials deposited on some layers. Additional teachings concerning the formation of structures on dielectric substrates and/or the formation of structures that incorporate dielectric materials into the formation process and possibility into the final structures as formed are set forth in a number of patent applications filed Dec. 31, 2003. The first of these filings is U.S. Patent Application No. 60/534,184 which is entitled "Electrochemical Fabrication Methods Incorporating Dielectric Materials and/or Using Dielectric Substrates". The second of these filings is U.S. Patent Application No. 60/533,932, which is entitled "Electrochemical Fabrication Methods Using Dielectric Substrates". The third of these filings is U.S. Patent Application No. 60/534,157, which is entitled "Electrochemical Fabrication Methods Incorporating Dielectric Materials". The fourth of these filings is U.S. Patent Application No. 60/533,891, which is entitled "Methods for Electrochemically Fabricating Structures Incorporating Dielectric Sheets and/or Seed layers That Are Partially Removed Via Planarization". A fifth such filing is U.S. Patent Application No. 60/533,895, which is entitled "Electrochemical Fabrication Method for Producing Multi-layer Three-Dimensional Structures on a Porous Dielectric". Additional patent filings that provide teachings concerning incorporation of dielectrics into the EFAB process include U.S. patent application Ser. No. 11/139,262, filed May 26, 2005, now U.S. Pat. No. 7,501,328, by Lockard, et al., and which is entitled "Methods for Electrochemically Fabricating Structures Using Adhered Masks, Incorporating Dielectric Sheets, and/or Seed Layers that are Partially Removed Via Planarization"; and U.S. patent application Ser. No. 11/029,216, filed Jan. 3, 2005 by Cohen, et al., now abandoned, and which is entitled "Electrochemical Fabrication Methods Incorporating Dielectric Materials and/or Using Dielectric Substrates". These patent filings are each hereby incorporated herein by reference as if set forth in full herein.

Some embodiments may employ diffusion bonding or the like to enhance adhesion between successive layers of material. Various teachings concerning the use of diffusion bonding in electrochemical fabrication processes are set forth in U.S. patent application Ser. No. 10/841,384 which was filed May 7, 2004 by Cohen et al., now abandoned, which is entitled "Method of Electrochemically Fabricating Multi-layer Structures Having Improved Interlayer Adhesion" and which is hereby incorporated herein by reference as if set forth in full. This application is hereby incorporated herein by reference as if set forth in full.

Further teaching about microprobes and electrochemical fabrication techniques are set forth in a number of prior US Patent Applications. These Filings include: (1) U.S. patent application Ser. No. 10/949,738 (P-US119-A-MF), filed Sep. 24, 2004, by Kruglick et al., now abandoned, and which is entitled "Electrochemically Fabricated Microprobes"; (2) U.S. patent application Ser. No. 11/028,945 (P-US134-A-MF), filed Jan. 3, 2005, by Cohen et al., now U.S. Pat. No. 7,640,651, and which is entitled "A Fabrication Method for Co-Fabricating a Probe Array and a Space Transformers". (3) U.S. patent application Ser. No. 11/029,180, filed Jan. 3, 2005, by Chen et al., now abandoned, and entitled "Pin-Type Probes for Contacting Electronic Circuits and Methods for Making Such Probes"; (4) U.S. patent application Ser. No. 11/325,404 (P-US153-A-MF), filed Jan. 3, 2005, by Chen et al., now abandoned, and entitled "Vertical Microprobes for Contacting Electronic Components and Method for Making Such Probes"; (5) U.S. patent application Ser. No. 11/029,217 (P-US122-A-MF), filed Jan. 3, 2005, by Kim et al., now U.S. Pat. No. 7,412,767, and entitled "Microprobe Tips and Methods For Making; and (6) U.S. patent application Ser. No. 11/173,241 (P-US137-A-MF), filed Jun. 30, 2005, by Kumar et al., now abandoned, and entitled "Probe Arrays and Methods for Making". These patent filings are each hereby incorporated herein by reference as if set forth in full herein.

Additional teachings concerning the formation of structures on dielectric substrates and/or the formation of structures that incorporate dielectric materials into the formation process and possibility into the final structures as formed are set forth in a number of patent applications: (1) U.S. patent application Ser. No. 11/028,957 (P-US127-A-SC), by Cohen, which was filed on Jan. 3, 2005, now abandoned, and which is entitled "Incorporating Dielectric Materials and/or Using Dielectric Substrates"; (2) U.S. patent application Ser. No. 10/841,300 (P-US099-A-MF), by Lockard et al., which was filed on May 7, 2004, now abandoned, and which is entitled "Methods for Electrochemically Fabricating Structures Using Adhered Masks, Incorporating Dielectric Sheets, and/or Seed Layers that are Partially Removed Via Planarization"; (3) U.S. patent application Ser. No. 10/841,378 (P-US106-A-MF), by Lembrikov et al., which was filed on May 7, 2004, now U.S. Pat. No. 7,527,721, and which is entitled "Electrochemical Fabrication Method for Producing Multi-layer Three-Dimensional Structures on a Porous Dielectric"; (4) U.S. patent application Ser. No. 11/029,216

(P-US128-A-MF), filed Jan. 3, 2005 by Cohen et al., now abandoned, and entitled "Electrochemical Fabrication Methods Incorporating Dielectric Materials and/or Using Dielectric Substrates"; and (5) U.S. patent application Ser. No. 11/325,405 (P-US152-A-MF), filed Jan. 3, 2006 by Dennis R. Smalley, now abandoned, and entitled "Method of Forming Electrically Isolated Structures Using Thin Dielectric Coatings". These patent filings are each hereby incorporated herein by reference as if set forth in full herein.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, and the like.

| U.S. Pat. App No., Filing Date U.S. App Pub No., Pub Date U.S. Pat. No., Pub Date | Inventor, Title |
|---|---|
| 09/493,496 - Jan. 28, 2000 — 6,790,377 - Sep. 14, 2004 | Cohen, "Method For Electrochemical Fabrication" |
| 10/677,556 - Oct. 1, 2003 2004-0134772 - Jul. 15, 2004 | Cohen, "Monolithic Structures Including Alignment and/or Retention Fixtures for Accepting Components" |
| 10/830,262 - Apr. 21, 2004 2004-0251142A - Dec. 16, 2004 7,198,704 - Apr. 3,2007 | Cohen, "Methods of Reducing Interlayer Discontinuities in Electrochemically Fabricated Three-Dimensional Structures" |
| 10/271,574 - Oct. 15, 2002 2003-0127336A - July 10, 2003 7,288,178 - Oct. 30, 2007 | Cohen, "Methods of and Apparatus for Making High Aspect Ratio Microelectromechanical Structures" |
| 10/697,597 - Dec. 20, 2002 2004-0146650A - Jul. 29, 2004 | Lockard, "EFAB Methods and Apparatus Including Spray Metal or Powder Coating Processes" |
| 10/677,498 - Oct. 1, 2003 2004-0134788 - Jul. 15, 2004 7,235,166 - Jun. 26, 2007 | Cohen, "Multi-cell Masks and Methods and Apparatus for Using Such Masks To Form Three-Dimensional Structures" |
| 10/724,513 - Nov. 26, 2003 2004-0147124 - Jul. 29, 2004 7,368,044 - May 6, 2008 | Cohen, "Non-Conformable Masks and Methods and Apparatus for Forming Three-Dimensional Structures" |
| 10/607,931- Jun. 27, 2003 2004-0140362 - Jul. 22, 2004 7,239,219 - Jul. 3,2007 | Brown, "Miniature RF and Microwave Components and Methods for Fabricating Such Components" |
| 10/841,100 - May 7,2004 2005-0032362 - Feb. 10, 2005 7,109,118 - Sep. 19, 2006 | Cohen, "Electrochemical Fabrication Methods Including Use of Surface Treatments to Reduce Overplating and/or Planarization During Formation of Multi-layer Three-Dimensional Structures" |
| 10/387,958 - Mar. 13, 2003 2003-022168A - Dec. 4, 2003 | Cohen, "Electrochemical Fabrication Method and Application for Producing Three-Dimensional Structures Having Improved Surface Finish" |
| 10/434,494 - May 7, 2003 2004-0000489A - Jan. 1, 2004 | Zhang, "Methods and Apparatus for Monitoring Deposition Quality During Conformable Contact Mask Plating Operations" |
| 10/434,289 - May 7, 2003 2004-0065555A - Apr. 8, 2004 | Zhang, "Conformable Contact Masking Methods and Apparatus Utilizing In Situ Cathodic Activation of a Substrate" |
| 10/434,294 - May 7, 2003 2004-0065550A - Apr. 8, 2004 | Zhang, "Electrochemical Fabrication Methods With Enhanced Post Deposition Processing" |
| 10/434,295 - May 7, 2003 2004-0004001A - Jan. 8, 2004 | Cohen, "Method of and Apparatus for Forming Three-Dimensional Structures Integral With Semiconductor Based Circuitry" |
| 10/434,315 - May 7, 2003 2003-0234179 A - Dec. 25, 2003 7,229,542 - Jun. 12, 2007 | Bang, "Methods of and Apparatus for Molding Structures Using Sacrificial Metal Patterns" |
| 10/434,103 - May 7, 2004 2004-0020782A - Feb. 5, 2004 7,160,429 - Jan. 9, 2007 | Cohen, "Electrochemically Fabricated Hermetically Sealed Microstructures and Methods of and Apparatus for Producing Such Structures" |
| 10/841,006 - May 7, 2004 2005-0067292 - May 31, 2005 | Thompson, "Electrochemically Fabricated Structures Having Dielectric or Active Bases and Methods of and Apparatus for Producing Such Structures" |
| 10/434,519 - May 7, 2003 2004-0007470A - Jan. 15, 2004 7,252,861 - Aug. 7, 2007 | Smalley, "Methods of and Apparatus for Electrochemically Fabricating Structures Via Interlaced Layers or Via Selective Etching and Filling of Voids" |
| 10/724,515 - Nov. 26, 2003 2004-0182716 - Sep. 23, 2004 7,291,254 - Nov. 6, 2007 | Cohen, "Method for Electrochemically Forming Structures Including Non-Parallel Mating of Contact Masks and Substrates" |
| 10/841,347 - May 7, 2004 2005-0072681 - Apr. 7, 2005 | Cohen, "Multi-step Release Method for Electrochemically Fabricated Structures" |
| 60/533,947 - Dec. 31, 2003 | Kumar, "Probe Arrays and Method for Making" |

| U.S. Pat. App No., Filing Date U.S. App Pub No., Pub Date U.S. Pat. No., Pub Date | Inventor, Title |
|---|---|
| 60/534,183 - Dec. 31, 2003 — — | Cohen, "Method and Apparatus for Maintaining Parallelism of Layers and/or Achieving Desired Thicknesses of Layers During the Electrochemical Fabrication of Structures" |
| 11/733,195 - Apr. 9, 2007 2008-0050524 - Feb. 28, 2008 — | Kumar, "Methods of Forming Three-Dimensional Structures Having Reduced Stress and/or Curvature" |
| 11/506,586 - Aug. 8, 2006 2007-0039828 - Feb. 22, 2007 7,611,616 - Nov. 3, 2009 | Cohen, "Mesoscale and Microscale Device Fabrication Methods Using Split Structures and Alignment Elements" |
| 10/949,744 - Sep. 24, 2004 2005-0126916 - Jun. 16, 2005 7,498,714 - Mar. 3, 2009 | Lockard, "Three-Dimensional Structures Having Feature Sizes Smaller Than a Minimum Feature Size and Methods for Fabricating" |
| 14/676,716 - Apr. 1, 2015 2015-0308006 - Oct. 29, 2015 — | Cohen, "Methods and Apparatus for Forming Multi-Layer Structures Including Use of A Sacrificial Patternable Mold Material" |
| 14/986,500 - Dec. 31, 2015 2016-0231356 - Aug. 11, 2016 — | Wu, "Multi-Layer, Multi-Material Micro-Scale and Millimeter-Scale Devices with Enhanced Electrical and/or Mechanical Properties" |
| 62/737,005 - Sep. 26, 2018 — — | Frodis, "Probes Having Improved Mechanical and/or Electrical Properties for Making Contact between Electronic Circuit Elements and Methods for Making" |
| XX/XXX,XXX - Sep. 26, 2019 Microfabrica Docket No. P-U5377-A-MF | Frodis, "Probes Having Improved Mechanical and/or Electrical Properties for Making Contact between Electronic Circuit Elements and Methods for Making" |

Though various portions of this specification have been provided with headers, it is not intended that the headers be used to limit the application of teachings found in one portion of the specification from applying to other portions of the specification. For example, alternatives acknowledged in association with one embodiment, are intended to apply to all embodiments to the extent that the features of the different embodiments make such application functional and do not otherwise contradict or remove all benefits of the adopted embodiment. Various other embodiments of the present invention exist. Some of these embodiments may be based on a combination of the teachings set forth herein with various teachings incorporated herein by reference.

It is intended that the aspects of the invention set forth herein represent independent invention descriptions which Applicant contemplates as full and complete invention descriptions that Applicant believes may be set forth as independent claims without need of importing additional limitations or elements, from other embodiments or aspects set forth herein, for interpretation or clarification other than when explicitly set forth in such independent claims once written. It is also understood that any variations of the aspects set forth herein represent individual and separate features that may form separate independent claims, be individually added to independent claims, or added as dependent claims to further define an invention being claimed by those respective dependent claims should they be written.

In view of the teachings herein, many further embodiments, alternatives in design and uses of the embodiments of the instant invention will be apparent to those of skill in the art. As such, it is not intended that the invention be limited to the particular illustrative embodiments, alternatives, and uses described above but instead that it be solely limited by the claims presented hereafter.

I claim:

1. A structure, comprises:
(a) a first planarized layer comprising at least a first structural material;
(b) a second planarized layer comprising at least a second structural material, wherein the second structural material has a relationship with the first planarized layer selected from the group consisting of:
  (1) the second structural material is directly adhered to the first planarized layer,
  (2) the second structural material is separated from the first planarized layer by one or more intermediate planarized layers, and
  (3) the second material is separated from the first planarized layer by one or more depositions of at least one intervening material;
(c) a third planarized layer comprising at least a third structural material, wherein the third structural material has a relationship with the second planarized layer selected from the group consisting of:
  (1) the third material is directly adhered to the second planarized layer,
  (2) the third material is separated from the second planarized layer by one or more additional intermediate planarized layers, and
  (3) the third material is separated from the second planarized layer by one or more depositions of at least one intervening material,
wherein the second planarized layer is located between the first and third planarized layers in a layer stacking direction,
wherein the second structural material is different from the first structural material and the second structural material is different from the third structural material,
wherein the structure is configured to provide an elastic electrical contact element that provides a conductive path along a length of the structure between at least two electronic components,
wherein each of at least one of the first to third planarized layers comprises at least one core structural material and at least one shell structural material, wherein the at least one of the core structural material and the at least one shell structural material of a respective layer corresponds to the respective structural material selected from the group consisting of the first structural material, second structural material, and third structural material while the other of the at least one shell structural material and at least one core structural material is a different material, and wherein the core structural material is laterally surrounded by structural material that is not core structural material on the respective layer and wherein the core structural material extends at least a portion of the axial length of the structure and has a length extending in an axial direction of the structure and has a first edge and a second edge, wherein the structure has first edge and a second edge corresponding with the first and second edges of the core, respectively, and wherein the first edge of the core is closer to the first edge of the structure than is the second edge of the core and wherein, along at least a portion of the length of the core, the second edge of the core is closer to the first edge of the structure than to the second edge of the structure.

* * * * *